(12) United States Patent
Matsushima

(10) Patent No.: US 8,106,668 B2
(45) Date of Patent: Jan. 31, 2012

(54) PROXIMITY DETECTOR AND PROXIMITY DETECTING METHOD

(75) Inventor: Kenichi Matsushima, Chiba (JP)

(73) Assignee: Seiko Instruments Inc. (JP)

(*) Notice: Subject to any disclaimer, the term of this patent is extended or adjusted under 35 U.S.C. 154(b) by 286 days.

(21) Appl. No.: 12/150,064

(22) Filed: Apr. 24, 2008

(65) Prior Publication Data
US 2008/0265914 A1    Oct. 30, 2008

(30) Foreign Application Priority Data

Apr. 24, 2007  (JP) ................................ 2007-113907
Oct. 15, 2007  (JP) ................................ 2007-267476

(51) Int. Cl.
*G01R 27/26* (2006.01)

(52) U.S. Cl. ......... 324/686; 324/658; 324/662; 324/678

(58) Field of Classification Search ................... 324/686
See application file for complete search history.

(56) References Cited

U.S. PATENT DOCUMENTS

| | | | | |
|---|---|---|---|---|
| 5,304,937 A | | 4/1994 | Meyer ........................... | 324/686 |
| 5,305,017 A | * | 4/1994 | Gerpheide .................... | 345/174 |
| 5,757,196 A | * | 5/1998 | Wetzel ......................... | 324/688 |
| 6,331,780 B1 | * | 12/2001 | Hiroshima et al. ........... | 324/684 |
| 2002/0070729 A1 | * | 6/2002 | Muller ....................... | 324/207.26 |
| 2002/0109672 A1 | * | 8/2002 | Kehlstadt et al. ............. | 345/157 |
| 2005/0134292 A1 | * | 6/2005 | Knoedgen ..................... | 324/658 |
| 2005/0248534 A1 | * | 11/2005 | Kehlstadt ..................... | 345/163 |
| 2006/0092142 A1 | * | 5/2006 | Gillespie et al. ............. | 345/173 |
| 2006/0267823 A1 | * | 11/2006 | Pinna et al. ................... | 341/143 |
| 2007/0152682 A1 | * | 7/2007 | Ungaretti et al. ............. | 324/678 |
| 2007/0164756 A1 | * | 7/2007 | Lee ............................... | 324/662 |
| 2008/0246495 A1 | * | 10/2008 | Zarabadi et al. ............. | 324/678 |

FOREIGN PATENT DOCUMENTS

EP      1327861      7/2003

* cited by examiner

*Primary Examiner* — Timothy J Dole
*Assistant Examiner* — Benjamin M Baldridge
(74) *Attorney, Agent, or Firm* — Adams & Wilks

(57) ABSTRACT

A proximity detector detects the approach of an object based on a stray capacitance. A differential electrode has an apparent stray capacitance that varies in response to an approaching object. An individual capacitance detector detects an individual stray capacitance of the differential electrode based on a stray capacitance of the differential electrode obtained by repeatedly charging and discharging the differential electrode in opposite phases and based on a stray capacitance of the differential electrode obtained by repeatedly charging and discharging the differential electrode in the same phase. A proximity calculator detects the approach of the object based on the detected individual stray capacitance.

2 Claims, 27 Drawing Sheets

Prior Art

Prior Art

| | SW1,11 | SW2,12 | SW3,13 | Vep | Vem | Vap | Vam | N | Remark |
|---|---|---|---|---|---|---|---|---|---|
| First Step | On | — | Off | — | — | 0 | Vdd | 0 | Initialization |
| Second Step | Off | On | Off | Vdd | 0 | Const | Const | inc | Charge |
| Third Step | Off | Off | On | Dec | Inc | Dec | Dec | Const | Accumulation |
| Fourth Step | | End of Determination | | | | | | | — |
| Fifth Step | | Acquisition of Ce | | | | | | | — |

PROXIMITY DETECTOR AND PROXIMITY DETECTING METHOD

BACKGROUND OF THE INVENTION

1. Field of the Invention

The present invention relates to a proximity detector and a proximity detecting method for detecting the approach and the position of an object such as a human finger based on a stray capacitance corresponding to an electrostatic capacitance intrinsic to the object.

2. Description of the Related Art

It is known that an apparent stray capacitance of an electrode increases when an object having a stray capacitance such as a human approaches the electrode. The application of this principle puts a proximity detector such as an electrostatic touch sensor into practical use.

In order to detect the stray capacitance of the electrode, the proximity detector as described above obtains the apparent stray capacitance of the electrode from the relation between a voltage and electric charges during charge or discharge of the electrode. It is, however, difficult to obtain an exact stray capacitance by charging or discharging the electrode only once since an increase in stray capacitance of the electrode, which is caused by the approach of a human or the like, is as small as around 1 pF. Accordingly, it is general to apply alternate voltage or to turn switches repeatedly to charge and discharge the electrode to accumulate a charge/discharge characteristic, thereby improving the detection accuracy of the stray capacitance (for example, see Japanese Patent Application Laid-Open No. H08-194025).

Conventional proximity detectors will be described referring to FIG. 2. In FIG. 2, an electrode 101 is an electrical conductor having an area for detecting the approach of an object, and has a stray capacitance in itself. When, for example, a human finger having a stray capacitance approaches the electrode 101, an apparent stray capacitance of the electrode 101 itself increases. A stray capacitance detector 2 detects the stray capacitance of the electrode 101. For this purpose, the stray capacitance detector 2 includes a charger/discharger 104 for repeatedly charging and discharging the electrode and a capacitance accumulation unit 105 for accumulating a charge/discharge characteristic to obtain the stray capacitance at higher accuracy.

A proximity calculator 3 determines whether the stray capacitance detected by the stray capacitance detector 2 corresponds to the approach of the presupposed object based on degree of change in capacitance or the like.

According to the conventional method as described above, however, a highly accurate detection is difficult because the increase in stray capacitance caused by the approach of the object is small as compared with the stray capacitance of the electrode itself.

In order to settle the above-mentioned difficulty, for example, as illustrated in FIG. 3, a pair of differential electrodes, each having substantially the same stray capacitance when no object is approaching, is charged and discharged in the same phase by a common-mode charger/discharger 114. Then, difference in charge/discharge characteristics is accumulated by a capacitance difference accumulation unit 115, enabling the detection of the difference in stray capacitance between the pair of differential electrodes 1 even to a subtle change in stray capacitance at high accuracy. However, if the pair of electrodes of the differential electrode is placed close to each other, a change in capacitance caused by the approach of the object is the same for each of the pair of differential electrodes. Accordingly, a difference in capacitance becomes difficult to detect. On the other hand, it is difficult to reduce the noise since separate placement of each differential electrode of the pair causes different degree of noise to affect the electrodes.

As another method, instead of the pair of differential electrodes, an electrode and a capacitor having the same capacitance value as that of a stray capacitance of the electrode when no object is approaching are used to constitute a differential electrode to capture only a change in stray capacitance of the electrode (for example, see Japanese patent Application Laid-Open No. 2006-146895).

Further, for the same purpose, for example, as illustrated in FIG. 4, a pair of differential electrode 1 is charged and discharged in phases opposite to each other by differential charger/discharger 4. Then, the sum of the charge/discharge characteristics is accumulated by a capacitance difference accumulation unit 115. Even in this manner, difference in stray capacitance between the pair of differential electrodes can be detected, and even a subtle change in stray capacitance can be detected at high accuracy (for example, see Japanese Patent Application Laid-Open No. 2003-214807).

Specifically, only difference in capacitance between the differential electrodes or between the electrode and the capacitor having the same capacitance as that of the electrode is detected to obtain the difference in electrostatic capacitance by the capacitance difference accumulation unit, thereby detecting the change in stray capacitance of the electrode at high accuracy.

Each of the proximity detectors described above has one or a pair of electrodes, and detects only the approach of an object. Next, conventional detectors including a plurality of electrodes provided on a support to detect both the approach and the position of an object having a stray capacitance will be described referring to FIG. 5.

In FIG. 5, a plurality of the electrodes 101 are provided at different positions. For each of the positions of the electrodes 101, the approach of an object is detected based on an increase in stray capacitance. Moreover, by using a plurality of electrodes having two axial detection directions, a two-dimensional position of the approaching object can be detected (for example, see U.S. Pat. No. 6,970,160 B2).

The stray capacitance detector 2 serves to detect the stray capacitance of each electrode, and is the same as that illustrated in FIG. 2 for proximity detection. Although a different stray capacitance detector may be used for each electrode, a commonly used part can be shared by the electrodes.

The proximity calculator 3 detects the approach and the position of an object based on a change in stray capacitance for each of the electrodes provided at different positions (for example, see U.S. Pat. No. 6,535,200 B2).

According to any one of the methods, a small stray capacitance of the electrode results in a high impedance. As a result, the detected stray capacitance is susceptible to noise or the like. In particular, when transparent support and electrodes are provided on a display face of a display device such as a liquid crystal display device, the proximity detector is greatly affected by the noise from the display device because the proximity detector is close to the display device.

In order to solve the problem of the effects of noise from the display device, a method of interrupting the detection of the stray capacitance only at the moment when a signal from the display device changes to generate the noise has been disclosed (for example, see Japanese Patent Application Laid-Open No. 2006-146895).

However, because the change in the signal from the display device is not the one and only source of the noise generation, the method does not necessarily provide a satisfactory solution. Accordingly, a distance between the proximity detector and the display device is increased to adversely increase a thickness of the entire device, or a thickness of a cover of the proximity detector cannot be sufficiently increased. Moreover, if the number of repeated times is increased to eliminate the effects of noise, a detection response speed is lowered to prevent an accurate detection with small effects of noise from being performed within a short time.

As described above, the conventional proximity detectors and proximity detecting methods have problems such as a large detection error, a response speed lowered for eliminating the effects of noise, the need of increasing a distance from a noise source for providing the proximity detector, and the need of reducing a thickness of the cover of the proximity detector.

SUMMARY OF THE INVENTION

An object of the present invention is to solve the above-mentioned problems and to realize a proximity detector and a proximity detecting method, which is capable of performing a stable detection at a high response speed even when a distance from a noise source is short and a thickness of a cover of the proximity detector is large.

The proximity detector according to the present invention includes: a differential electrode for detecting approach of an object as a change in stray capacitance; a stray capacitance detector for obtaining a composite value of apparent stray capacitances of the differential electrode; and proximity calculator for detecting the approach of the object supposed from the composite value of the stray capacitances. The stray capacitance detector includes; differential charger/discharger for repeatedly charging and discharging the differential electrode; and capacitance accumulation/composition unit for accumulating a characteristic of the charge and discharge repeated by the differential charger/discharger for the differential electrode to obtain the composite value of the apparent stray capacitances of the differential electrode.

Similarly, the proximity detecting method according to the present invention includes: a stray capacitance detection step including a differential charge/discharge step of repeatedly charging and discharging a differential electrode for detecting approach of an object as a change in stray capacitance and a capacitance accumulation/combination step of accumulating a characteristic of the charge and discharge repeated by the differential charge/discharge step for the differential electrode to obtain a composite value of apparent stray capacitances of the differential electrode; and a proximity computation step of detecting the approach of the supposed object based on the composite value of the stray capacitances.

According to the present invention, even when the proximity detector is close to a noise source or a thickness of a cover of the proximity detector is large, the proximity detector and the proximity detecting method, which permit a stable detection at a high response speed, can be realized.

BRIEF DESCRIPTION OF THE DRAWINGS

In the accompanying drawings.

DESCRIPTION OF THE PREFERRED EMBODIMENTS

Embodiment 1

Figure 1:
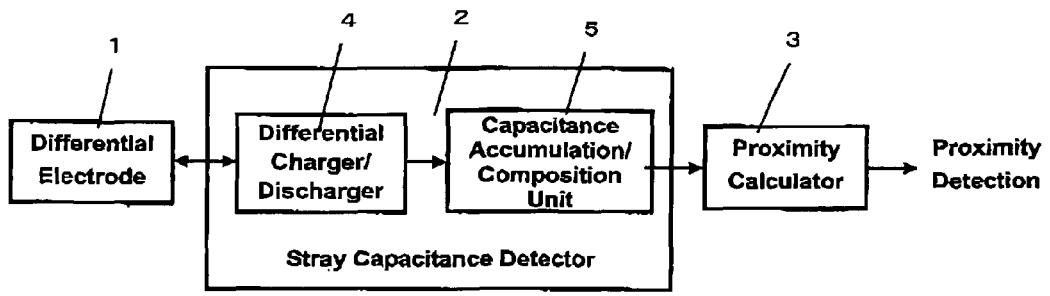
FIG. 1 is a block diagram illustrating a first embodiment of a proximity detector according to the present invention.
Figure 2:
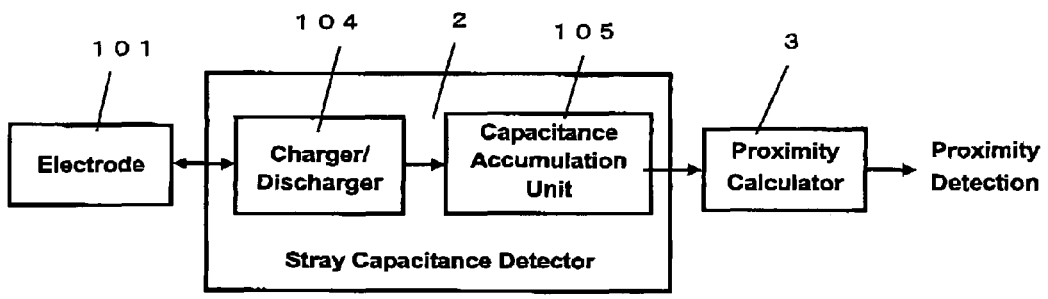
FIG. 2 is a block diagram illustrating a conventional proximity detector.
Figure 3:
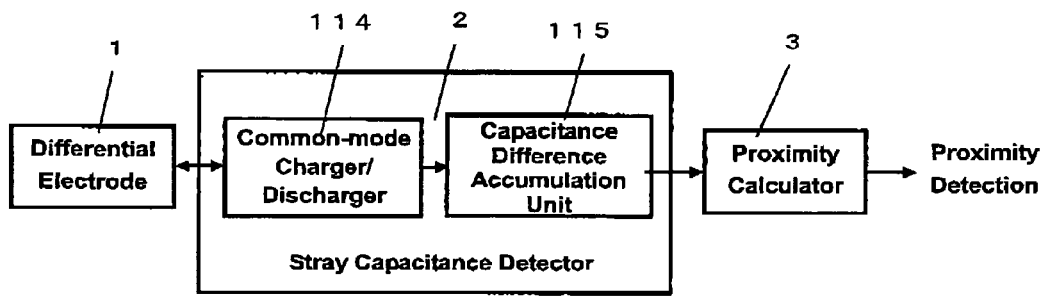
FIG. 3 is a block diagram illustrating another conventional proximity detector.
Figure 4:
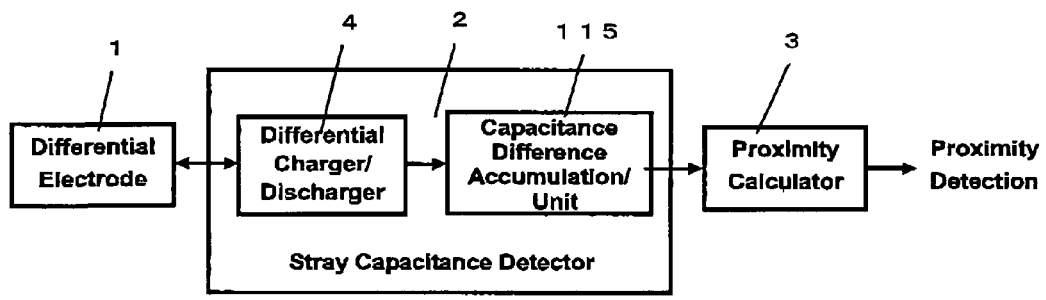
FIG. 4 is a block diagram illustrating still another conventional proximity detector.
Figure 5:
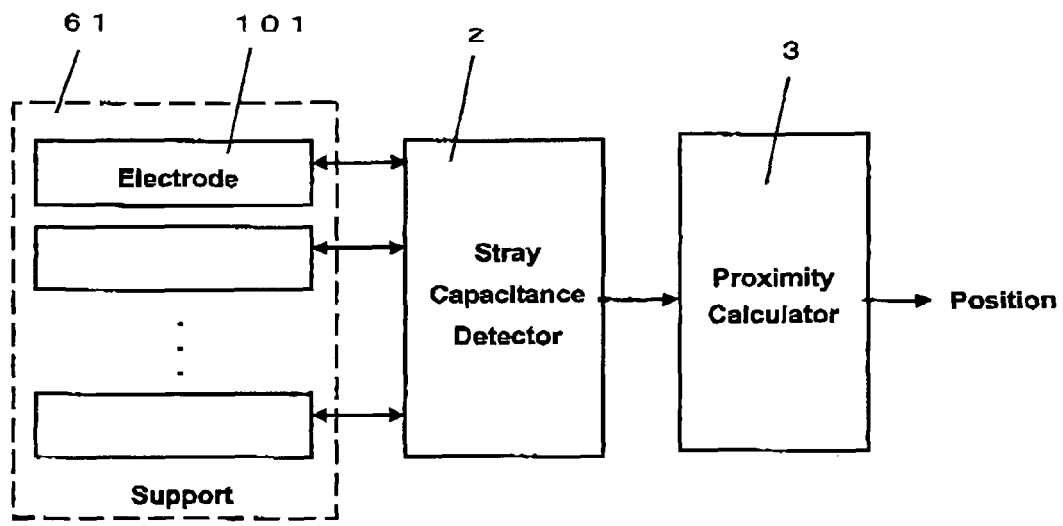
FIG. 5 is a block diagram illustrating still another conventional proximity detector.

A preferred embodiment of the present invention will be described referring to FIG. 1.

A proximity detector according to the present invention includes a differential electrode for detecting approach of an object as a change in stray capacitance, a stray capacitance detector for obtaining a composite value of apparent stray capacitances of the differential electrode, and proximity calculator for detecting the approach of the object supposed from the composite value of the stray capacitances. The stray capacitance detector includes a differential charger/discharger for repeatedly charging and discharging the differential electrode, and capacitance accumulation/composition unit for accumulating a characteristic of the charge and discharge repeated by the differential charger/discharger for the differential electrode to obtain the composite value of the apparent stray capacitances of the differential electrode.

Hereinafter, each constituent in the proximity detector according to the present invention and each step in a proximity detecting method according to the present invention will be described in detail.

Figure 6:
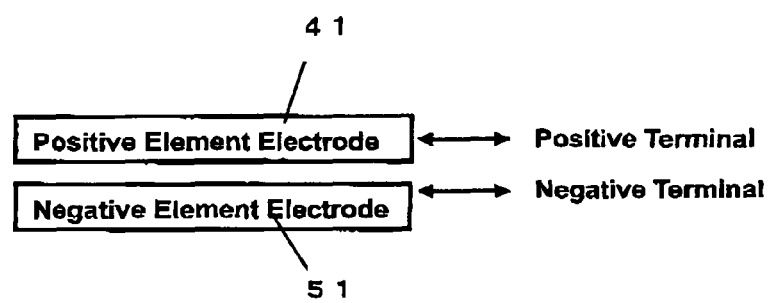
FIG. 6 is a structural view illustrating a differential electrode according to the present invention.

A differential electrode 1 increases an apparent stray capacitance in response to approach of an object. As illustrated in FIG. 6, the differential electrode 1 includes a positive element electrode 41 having a positive attribute, which is connected to a positive electrode terminal ep, and a negative element electrode 51 having a negative attribute, which is connected to a negative electrode terminal em. Each of the positive element electrode 41 and the negative element electrode 51 constituting the differential electrode 1 increases the apparent stray capacitance when the object approaches. The positive element electrode 41 and the negative element electrode 51, which constitute the differential electrode 1, are provided to be close to each other in substantially parallel or a twisted wire pattern to be easily affected to the same degree when a noise is generated. Similarly, lines connecting the differential electrode 1 and the stray capacitance detector 2 are arranged close to each other in substantially parallel or a twisted wire pattern to reduce the effects of noise to have substantially the same value in the differential electrode 1 and in the stray capacitance detector 2.

Figure 7:
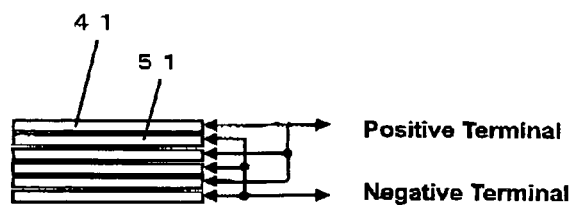
FIG. 7 is another structural view illustrating the differential electrode according to the present invention.

In the differential electrode 1, as illustrated in FIG. 7, a plurality of the positive element electrodes 41 and a plurality of the negative element electrodes 51 are alternately arranged in a segmented pattern to be positioned further closer to each other to further reduce the noise applied to the positive element electrode 41 and that applied to the negative element electrode 51.

Further, when the differential electrode 1 is provided on a display device driven by a line-sequential system for use, a direction of the element electrodes (41 and 51) is not set parallel to a line direction of the line-sequential driving to enable the reduction in the effects of noise.

When the electrodes are provided in the segmented pattern as described above, impedance of each element electrode increases. However, because the electrodes are connected in parallel, total impedance is scarcely increased. Accordingly, the segmentation of the electrodes does not make the electrodes more susceptible to the effects of noise.

For the convenience of the description, the case using a pair of element electrodes as illustrated in FIG. 6 will be described below in detail. The same description is, however, also applied to the case using the segmented element electrodes as illustrated in FIG. 7 are used.

The stray capacitance detector 2 detects a composite value of the stray capacitances of the differential electrode 1. For this purpose, the stray capacitance detector 2 includes a differential charger/discharger 4 for repeatedly charging and discharging the differential electrode 1, and a capacitance accumulation/composition unit 5 for accumulating a characteristic of the charge and discharge to convert the accumulated characteristic of the charge and discharge into the composite value of the stray capacitances of the differential electrode 1.

Figure 8:
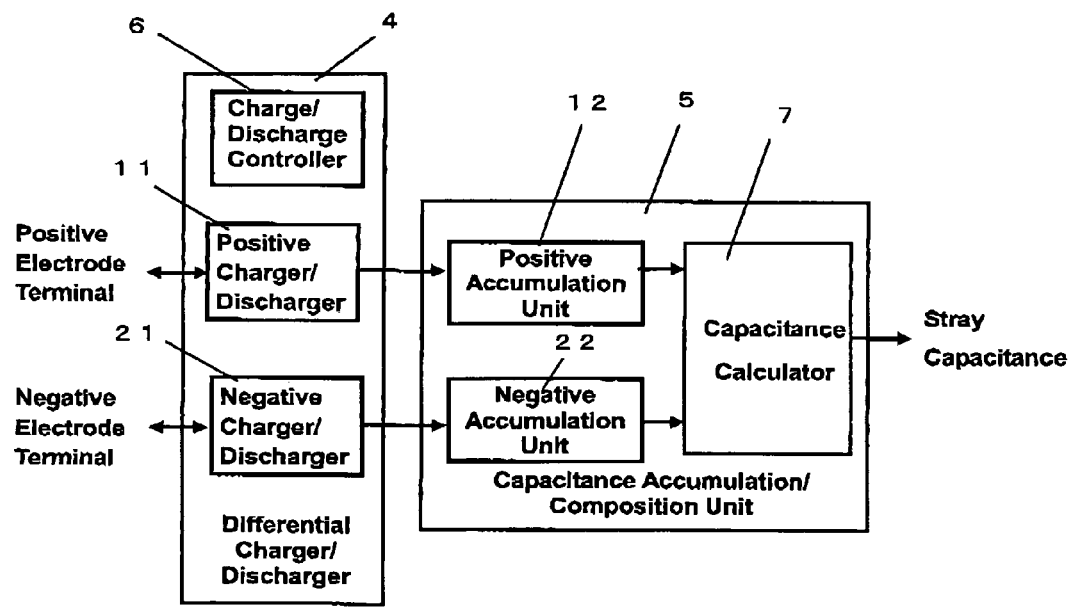
FIG. 8 is a block diagram illustrating a stray capacitance detector according to the present invention.
Figures 9, 10:
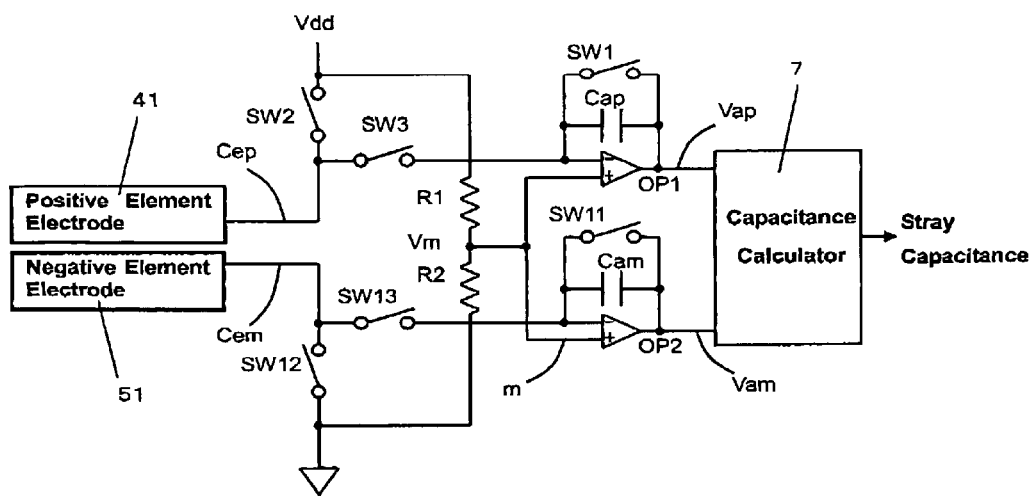
FIG. 9 is a connection diagram illustrating the stray capacitance detector according to the present invention.
FIG. 10 is a detection step diagram illustrating the stray capacitance detector according to the present invention.

As illustrated in FIGS. 8 and 9, the differential charger/discharger 4 includes charge/discharge controller 6, positive charger/discharger 11, and negative charger/discharger 21. The capacitance accumulation/composition unit 5 includes a positive accumulation unit 12, a negative accumulation unit 22, and a capacitance calculator 7.

As illustrated in FIG. 10, the charge/discharge controller 6 controls an operation of the stray capacitance detector 2. Specifically, after initializing the stray capacitance detector 2, the charge/discharge controller 6 controls a sequence from the repeated charge and discharge for a predetermined times to the detection of the stray capacitance. In FIG. 10, however, it is apparent that an interval can be provided between the steps to avoid simultaneous turn on of switches in different steps.

In Step 1 of the sequence, a count value N of the number of repeated cycles is initialized to 0. At the same time, switches SW1 and SW11 are turned on to short-circuit both ends of a feedback capacitor Cap of the positive accumulation unit 12 and those of a feedback capacitor Cam of the negative accumulation unit 22 to perform initialization.

In Step 2, one is added to the number of repeated cycles N, and only switches SW2 and SW12 are turned on to charge the differential electrode.

In Step 3, only switches SW3 and SW13 are turned on to discharge the differential electrode. At the same time, the discharged electric charges are accumulated in the capacitance accumulation/composition unit 5.

When the number of repetition of Steps 2 and 3 is decided to have reached the predetermined number, a composite value of the stray capacitances of the differential electrode is obtained by the capacitance calculator 7 in Step 5. However, instead of the decision based on the predetermined number of repetition in Step 4, the repetition of Steps 2 and 3 may be terminated when the stray capacitance in the capacitance calculator 7 to be described later converges.

By turning the switch SW2 on in Step 2, the positive charger/discharger 11 connects a DC power supply Vdd for supplying a positive voltage to the positive electrode terminal ep to charge the element electrode having the positive attribute with positive electric charges. In this case, the switch SW3 is turned off. In Step 3, the switch SW2 is turned off, whereas the switch SW3 is turned on to discharge the positive electric charges in the element electrode having the positive attribute to an inverting input terminal of an operational amplifier OP1. The type of the positive charger/discharger 11 is not limited as long as the positive charger/discharger 11 performs charge and discharge to feed a current to the positive element electrode during the charge and to draw a current from the positive element electrode during the discharge.

Similarly, the negative charger/discharger 21 turns the switch SW12 on in Step 2 to connect a ground for supplying 0 V to the negative electrode terminal em to charge the element electrode having the negative attribute with negative electric charges. In this case, the switch SW13 is turned off. In Step 3, the switch SW12 is turned off, whereas the switch SW13 is turned on to discharge the negative electric charges in the element electrode having the negative attribute to an inverting input terminal of an operational amplifier OP2. The type of the negative charger/discharger 21 is not limited as long as the negative charger/discharger 21 performs charge and discharge to draw a current from the negative element electrode during the charge and to feed a current to the negative element electrode during the discharge, in the manner contrary to the positive charger/discharger 11. The positive accumulation unit 12 accumulates the positive electric charges discharged from the positive element electrode in the feedback capacitor Cap of the operational amplifier OP1, and converts the accumulated positive electric charges into a voltage Vap. For this purpose, the feedback capacitor Cap is initialized by the switch SW1 in Step 1. Similarly, the negative accumulation unit 22 accumulates the negative electric charges discharged from the negative element electrode in the feedback capacitor Cam of the operational amplifier OP2, and converts the accumulated negative electric charges into a voltage Vam. Although an electrostatic capacitance Cap of the capacitor of the positive accumulation unit 12 and an electrostatic capacitance Cam of the capacitor of the negative accumulation unit 22 are set to the same value Ca in this case, the values of the electrostatic capacitances are not limited thereto. The feedback capacitor Cam is initialized by the switch SW11 in Step 1. Although non-inverting input terminals of the operational amplifiers OP1 and OP2 are set at a divided voltage Vm by resistors R1 and R2 between the DC power supply voltage Vdd and the ground, the non-inverting input terminals may be set at any voltage as long as the voltage is at an intermediate potential. In view of the characteristics of circuits of the operational amplifiers OP1 and OP2, though an output voltage of each of the positive accumulation unit 12 and the negative accumulation unit 22 is multiplied by −1 in this embodiment, the output voltages are not limited thereto.

The capacitance calculator 7 obtains a stray capacitance of the differential electrode, specifically, the sum of a stray capacitance Cep of the positive element electrode and a stray capacitance Cem of the negative element electrode, from a difference in output voltage between the positive accumulation unit 12 and the negative accumulation unit 22 according to Equation 1 obtained based on the relation in the conservation of a total amount of electric charges. A minus sign appears on the right-hand side because the polarity is reversed between the positive accumulation unit 12 and the negative accumulation unit 22.

$$Cep+Cem=-Ca \times (Vap-Vam) \div (N \times Vdd \div 2) \quad \text{(Equation 1)}$$

Operation of detecting the sum of the stray capacitances of the positive element electrode and the negative element electrode of the differential electrode while removing noise will be described referring to FIGS. 11A and 11B.

Figure 11A:
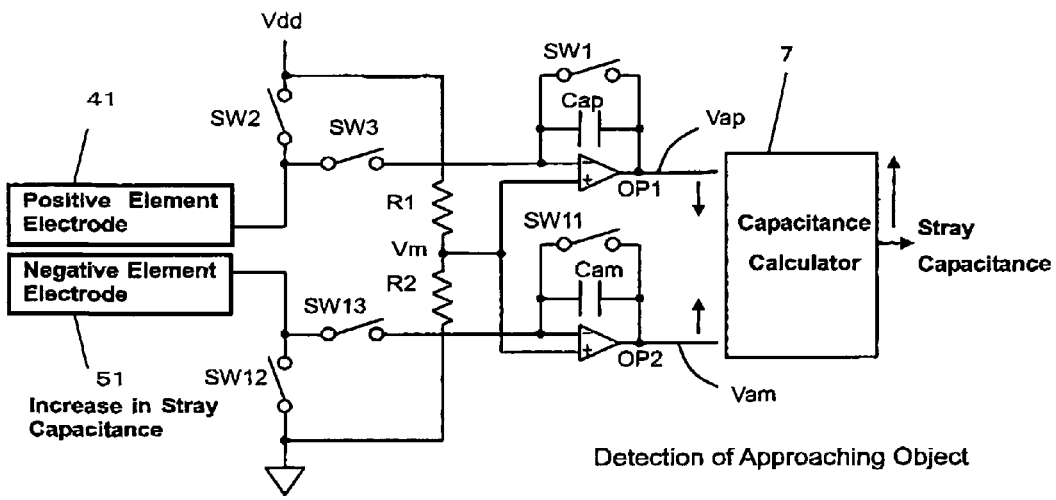
FIGS. 11A and 11B are conceptual diagrams illustrating the effects of the present invention.
Figure 11B:
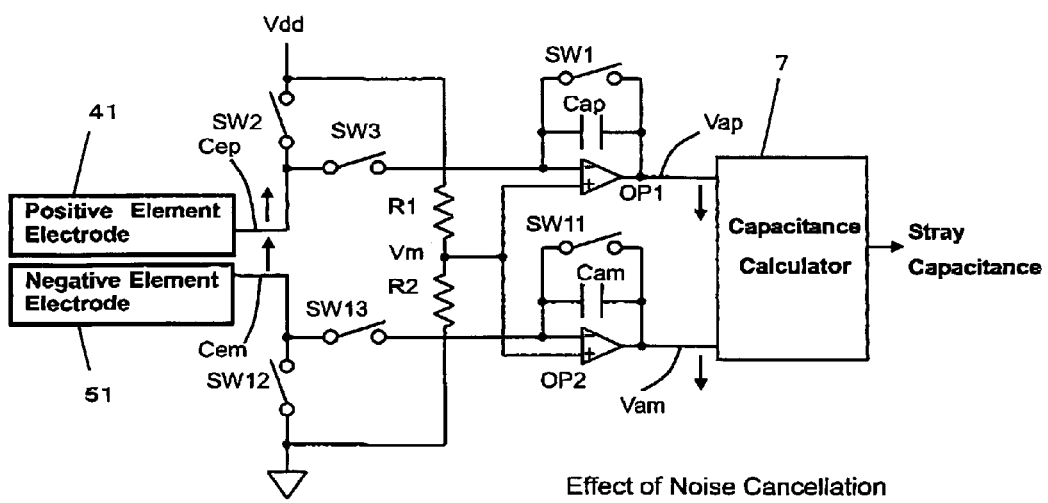

Approach of an object to the differential electrode increases the apparent stray capacitances of both the positive element electrode and the negative element electrode as illustrated in FIG. 11A, and also increases the amount of electric charges stored in the positive element electrode and the negative element electrode during the charge. Accordingly, the amount of electric charges accumulated in the capacitors of the positive accumulation unit 12 and the negative accumulation unit 22 during the discharge also increases to lower the output voltage Vap of the operational amplifier OP1 of the positive accumulation unit 12 and to increase the output voltage Vam of the operational amplifier OP2 of the negative accumulation unit 22. Consequently, the stray capacitance detected by the capacitance calculator 7 increases.

On the other hand, as illustrated in FIG. 11, increase in the voltages of the positive element electrode and the negative element electrode by noise lowers both the output voltage Vap and Vam of the operational amplifiers OP1 and OP2 of the positive accumulation unit 12 and the negative accumulation unit 22 to cancel each other in the capacitance calculator 7 to remove the effects of noise. When lowering of both the voltages of the positive element electrode and the negative element electrode by noise happens, the effects of noise can also be removed similarly.

As described above, because the effects of noise on the positive element electrode and those on the negative element electrode of the differential electrode are the same, it is necessary to charge and discharge the positive element electrode and the negative element electrode of the differential electrode in the opposite phases for canceling the noise while obtaining the sum of the stray capacitances of the positive element electrode and the negative element electrode of the differential electrode. In other words, the present invention is characterized in that the positive element electrode and the negative element electrode of the differential electrode are charged and discharged in the opposite phases to obtain the sum of the stray capacitances of the positive element electrode and the negative element electrode of the differential electrode, thereby removing the effects of noise.

An example of the capacitance accumulation/composition unit 5 using the operational amplifiers has been described above. Alternatively, a general-purpose CPU or the like may be used to reduce cost for the circuit in which the electric charges can be simply accumulated in the capacitors of the positive accumulation unit 12 and the negative accumulation unit 22 without using the operational amplifiers. Even in this case, the operation of the differential charger/discharger 4 or the operation steps of the entire stray capacitance detector 2 are almost the same as those in the above-mentioned case where the operational amplifiers are used. Hereinafter, differences from the above-mentioned case where the operational amplifiers are used will thus be mainly described in detail referring to FIGS. 12 and 13.

In Step 1, the positive accumulation unit 12 initializes the voltage Vap of the capacitor Cap to 0 V. In Step 3, the electric charges are simply accumulated in the capacitor Cap without using the operational amplifier. The voltage Vap of the capacitor Cap is not proportional to the number of repeated cycles N, but approaches to the voltage Vdd as expressed by Equation 2 at a ratio of the stray capacitance Cep of the positive element electrode to the capacitor Cap of the positive accumulation unit 12 even if the accumulation of the positive electric charges discharged from the positive element electrode is repeated.

$$Vap=Vdd \times [1-\{Ca \div (Cep+Ca)\}^N] \quad \text{(Equation 2)}$$

Similarly, in Step 1, the negative accumulation unit 22 initializes the voltage Vam of the capacitor Cam to the voltage Vdd. In Step 3, the voltage Vam of the capacitor Cam of the negative accumulation unit 22 gets closer to 0 V as expressed by Equation 3 at a ratio of the stray capacitance Cem of the negative element electrode to the capacitor Cap of the negative accumulation unit 22.

$$Vam=Vdd \times [\{Ca \div (Cem+Ca)\}] \quad \text{(Equation 3)}$$

The capacitance calculator 7 individually obtains the stray capacitance Cep of the positive element electrode and the stray capacitance Cem of the negative element electrode, and calculates the sum of the stray capacitances Cep and Cem. The calculation in the capacitance calculator 7 can be easily performed by using, for example, a CPU or the like.

Figure 13:
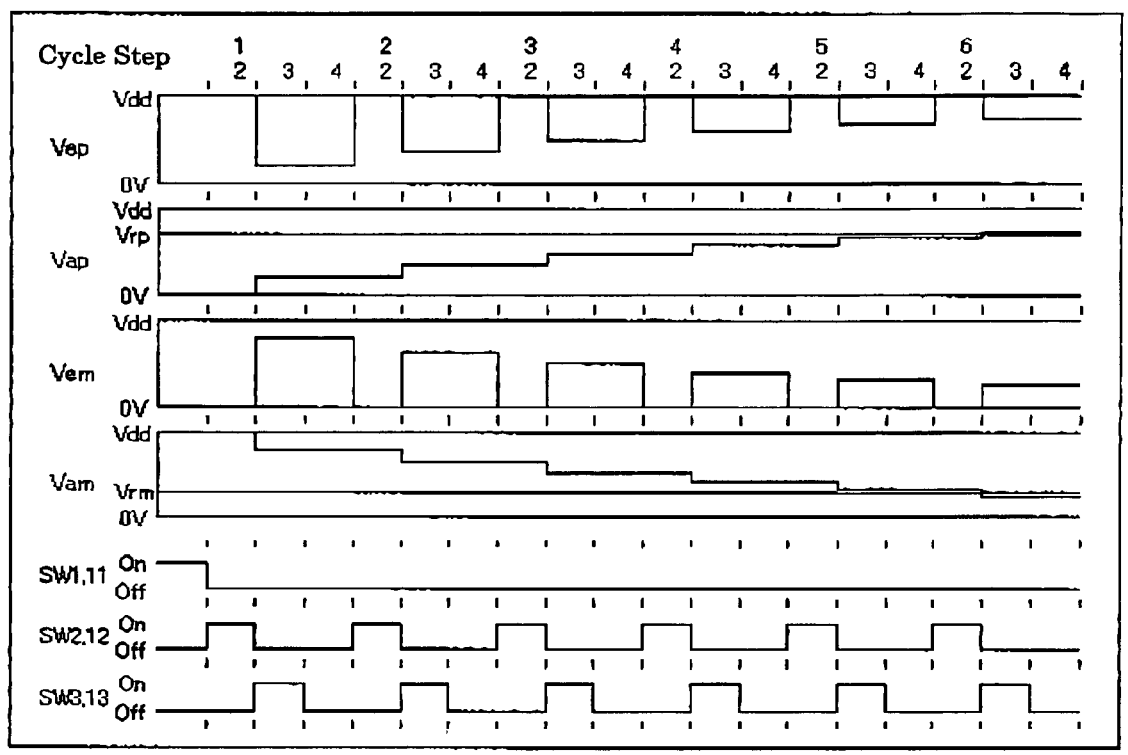
FIG. 13 is a timing chart illustrating the stray capacitance detector according to the present invention.

The stray capacitance Cep of the positive element electrode is obtained, as illustrated in FIG. 13, from the number of cycles N until the output voltage Vap of the positive accumulation unit 12 becomes larger than a predefined reference voltage Vrp. An example of the calculation Equation is obtained by substituting Vap in Equation 2 with Vref, and is solved in advance for Cep.

The stray capacitance Cem of the negative element electrode is obtained, as illustrated in FIG. 13, from the number of cycles N until the output voltage Vam of the negative accumulation unit 22 becomes smaller than a predefined reference voltage Vrm. An equation is similarly obtained from easily solving Equation 3 for Cem.

The noise removal effects obtained by merely accumulating the electric charges in the capacitors of the positive accumulation unit 12 and the negative accumulation unit 22 without using the operational amplifiers will now be described. If the noise increases both the voltages of the positive element electrode and the negative element electrode, the voltage Vap of the capacitor of the positive accumulation unit 12 and the voltage Vam of the capacitor of the negative accumulation unit 22 are both increased. Since the voltage Vap of the capacitor of the positive accumulation unit 12 increases from 0 V toward Vdd, in order to allow the voltage Vap to reach the reference voltage Vrp faster, the number of cycles N is reduced while the obtained stray capacitance Cep is increased when the stray capacitance Cep of the positive element electrode is to be obtained. On the contrary, since the voltage Vap of the capacitor of the negative accumulation unit 22 decreases from Vdd toward 0 V, in order to allow the voltage Vap to reach the reference voltage Vrm slower, the number of cycles N is increased while the obtained stray capacitance Cem is reduced when the stray capacitance Cem of the negative element electrode is to be obtained. Accordingly, by calculating the sum of the stray capacitance Cep of the positive element electrode and the stray capacitance Cem of the negative element electrode, the effects of noise cancel each other to be greatly reduced.

In the above-mentioned case, the sum of the stray capacitances are obtained after each of the stray capacitance Cep of the positive element electrode and the stray capacitance Cem of the negative element electrode is individually obtained. However, as illustrated in FIG. 7, when the differential electrodes are provided in a sufficiently segmented pattern to make the stray capacitance Cep of the positive element electrode and the stray capacitance Cem of the negative element electrode substantially the same, the sum of the stray capacitance Cep of the positive element electrode and the stray capacitance Cem of the negative element electrode may be obtained from the number of cycles N which is required for a value, which is obtained by subtracting the voltage Vam of the capacitor of the negative accumulation unit 22 from the voltage Vap of the capacitor of the positive accumulation unit 12, to reach a reference voltage Vr.

Figure 14:
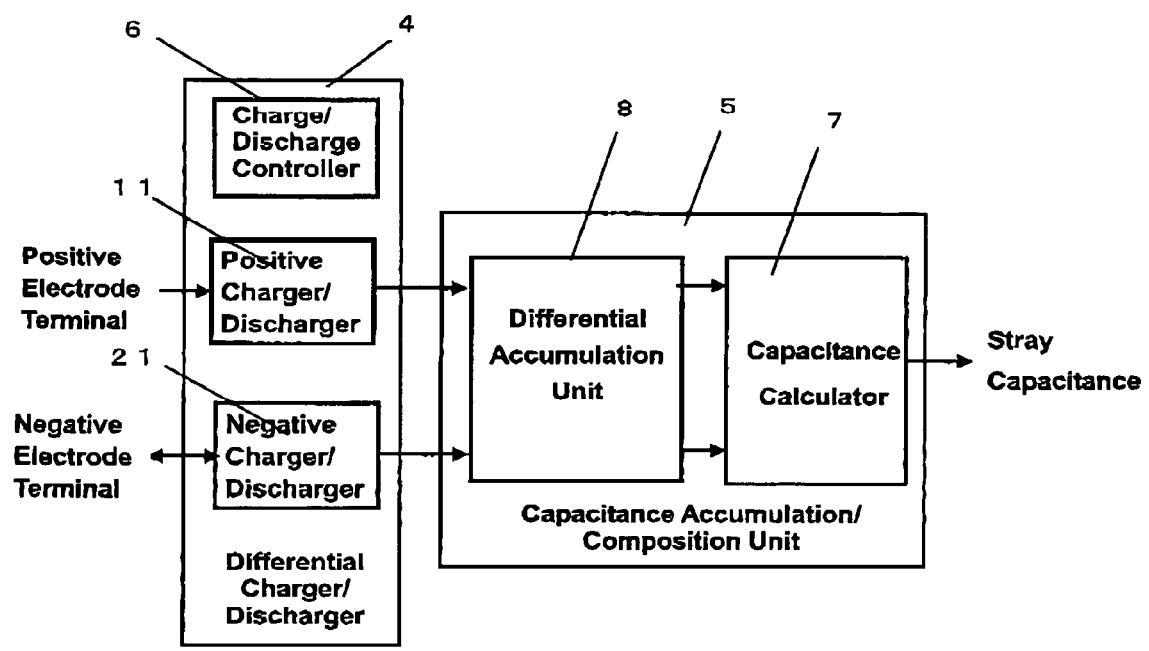
FIG. 14 is a block diagram illustrating the stray capacitance detector according to the present invention.
Figure 15:
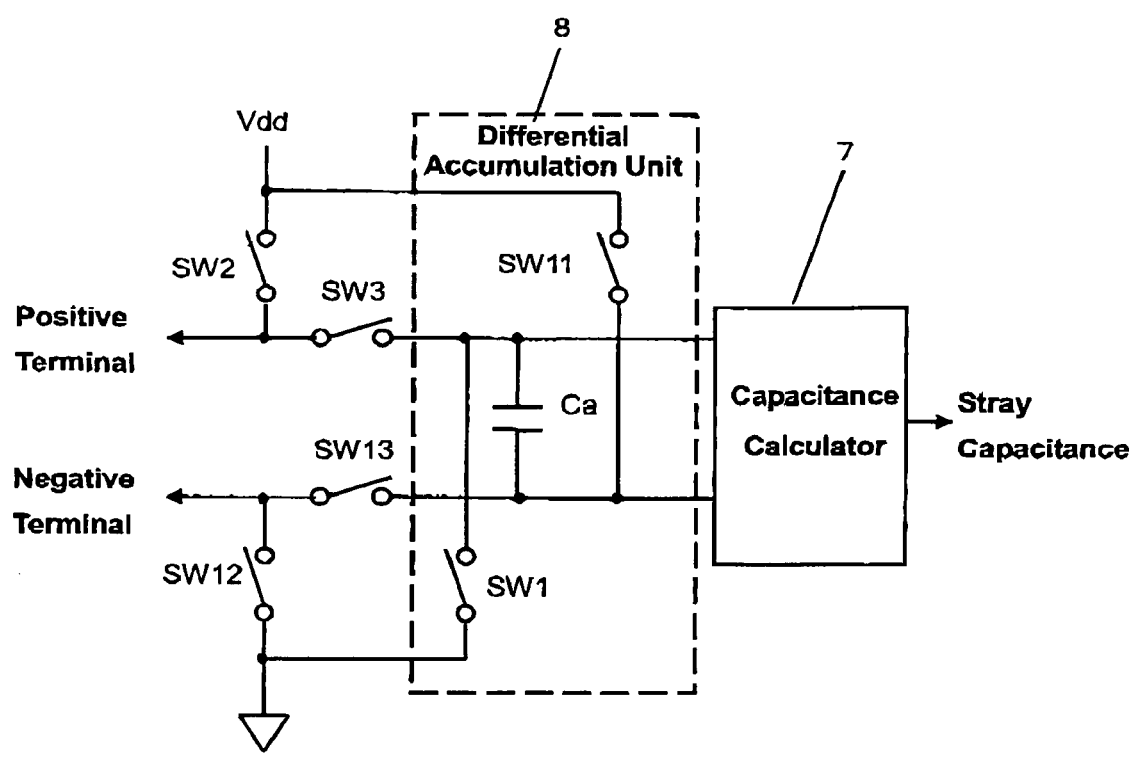
FIG. 15 is a connection diagram illustrating the stray capacitance detector according to the present invention.

The capacitance accumulation/composition unit 5 may include differential accumulation unit 8 obtained by combining the function of the positive accumulation unit 12 and that of the negative accumulation unit 22 into one, and the capacitance calculator 7, as illustrated in FIGS. 14 and 15.

Figure 16:
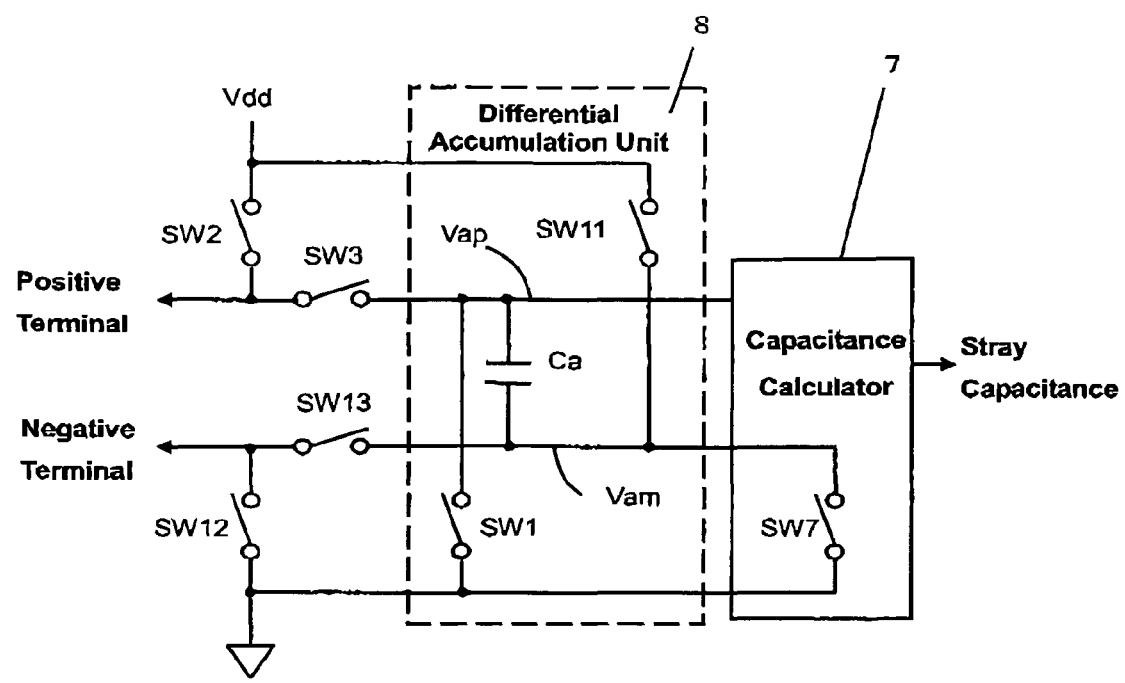
FIG. 16 is another connection diagram illustrating the stray capacitance detector according to the present invention.

Further, in this case, as illustrated in FIG. 16, by turning a switch SW7 of the capacitance calculator 7 on in Step 4, a difference in voltage between both ends of the capacitor of the differential accumulation unit 8 can be obtained. The sum of the stray capacitances of the differential electrode is obtained from the obtained difference in voltage by the above-mentioned method.

The stray capacitance detector 2 for detecting the stray capacitance of the differential electrode while removing the noise has been described above. Next, another stray capacitance detector which removes even the stray capacitance of the differential electrode itself when no object is approaching to enable a highly accurate detection of an increase in stray capacitance, which is caused by the approach of the object, will be described referring to FIG. 17.

Figure 12:
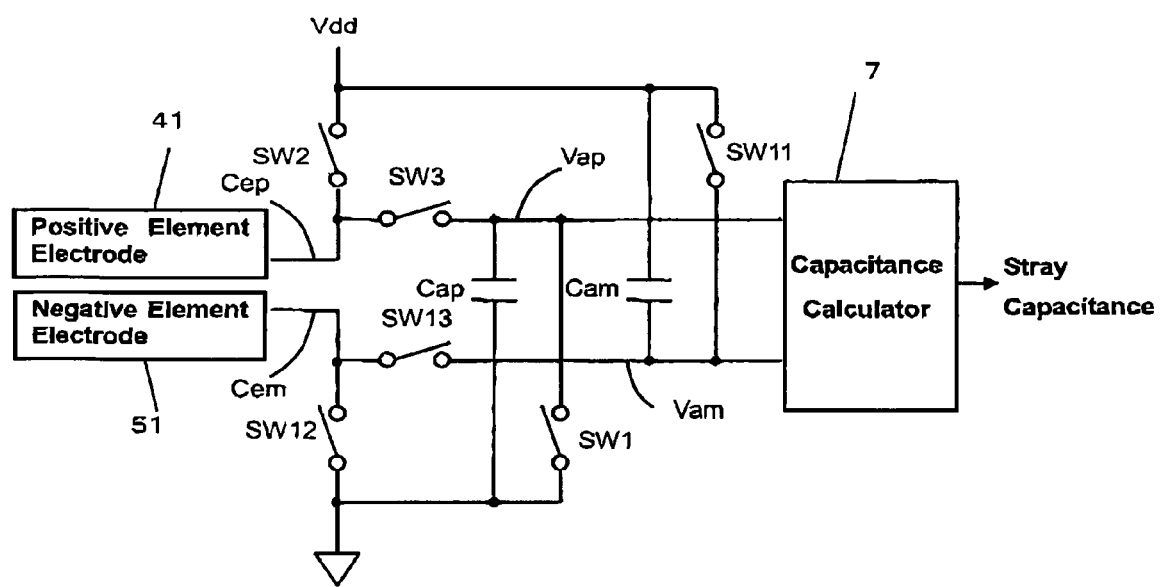
FIG. 12 is a connection diagram illustrating the stray capacitance detector according to the present invention.
Figure 17:
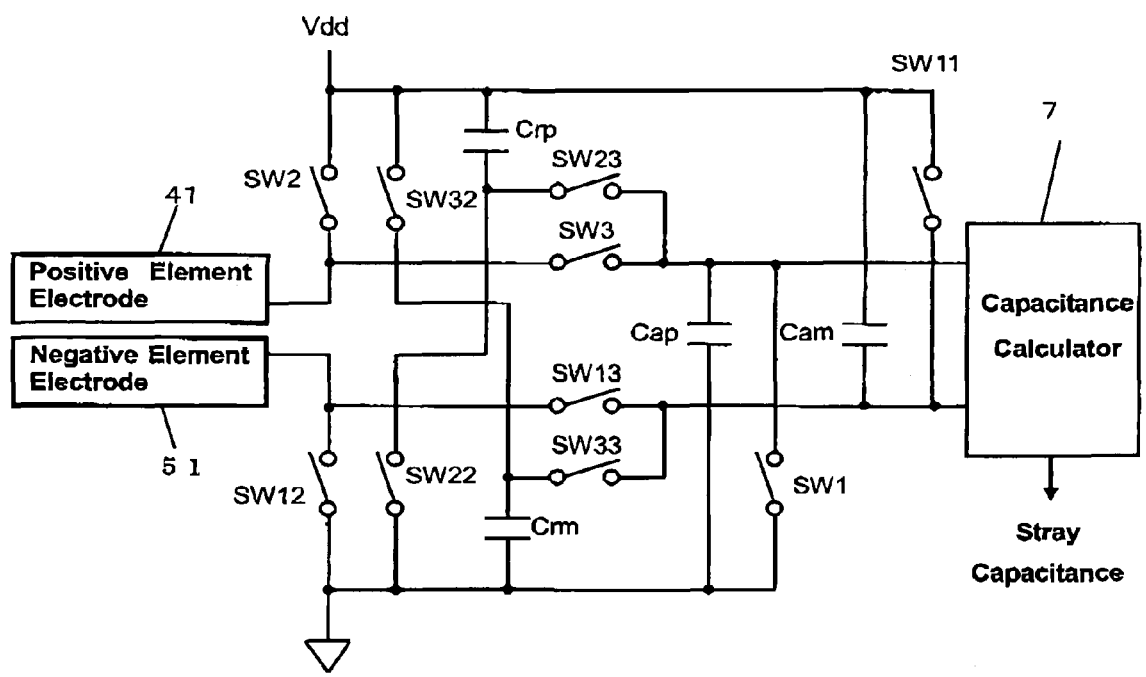
FIG. 17 is still another connection diagram illustrating the stray capacitance detector according to the present invention.

The stray capacitance detector illustrated in FIG. 17 is obtained by adder for removing the stray capacitance of the differential electrode itself to the stray capacitance detector 2 illustrated in FIG. 12. In FIG. 17, a capacitor Crp and switches SW22 and SW23 are provided to remove the stray capacitance specific to the positive element electrode, whereas a capacitor Crm and switches SW32 and SW33 are provided to remove the stray capacitance specific to the negative element electrode. Accordingly, a value of the capacitor Crp is set to the same value as that of the stray capacitance of the positive element electrode when no object is approaching, whereas a value of the capacitor Crm is set to the same value as that of the stray capacitance of the negative element electrode when no object is approaching.

During the charge in Step 2, by the switch SW22, the capacitor Crp is negatively charged from 0 V corresponding to the voltage opposite to that of the positive element electrode. During the discharge in Step 3, the accumulation in the positive accumulation unit 12 by the discharge from the positive element electrode is cancelled by the switch SW23. Similarly, during the charge in Step 2, by the switch SW32, the capacitor Crm is charged from the voltage Vdd corresponding to the voltage opposite to that of the negative element electrode. During the discharge in Step 3, by the switch SW33, the accumulation in the negative accumulation unit 22, which is caused by the discharge from the negative element electrode, is cancelled. In this manner, the electric charges corresponding to an increase in stray capacitance of the differential electrode, which is generated by the approach of the object, are accumulated in the positive accumulation unit 12 and the negative accumulation unit 22. Accordingly, only the increase in stray capacitance, which is caused by the approach of the object, is detected at high accuracy by the capacitance calculator 7. As a result, the proximity calculator can more precisely determine the approach of the object.

Although the charge is performed in the opposite phases and the capacitances are then added during the discharge to cancel the capacitances when no object is approaching in the above-descried case, the same effects can be obtained by performing the charge in the same phases and then canceling the capacitances by a subtraction.

The above case is not applied to the stray capacitance detector using switching. Any stray capacitance detector can be used as long as the a differential charger/discharger 4 repeats the charge and the discharge to simultaneously make the flow directions of the currents for charging and discharging the positive element electrode and the negative element electrode of the differential electrode opposite to each other and the stray capacitance detector obtains the composite stray capacitance of the differential electrode from the characteristic of the charge and discharge.

Although the example of the stray capacitance detector for charging and discharging the differential electrode by switching has been described above, the differential electrode can also be charged and discharged by the application of an AC. For example, the stray capacitance detector for applying the AC to the electrodes does not need any capacitance detection controller or switches, and is realized as an analog circuit. An example of the stray capacitance detector for applying the AC to the differential electrode to charge and discharge the differential electrode will be described in detail referring to FIGS. 18 and 19.

The stray capacitance detector for applying the AC to charge and discharge the differential electrode includes, as in the case of the stray capacitance detector using switching, the differential charger/discharger 4 including a positive charger/discharger 11 and a negative charger/discharger 21, and the capacitance accumulation/composition unit 5. However, the positive charger/discharger 11 includes AC voltage generator 13 and a positive electricity resistor 14, whereas a negative charger/discharger 21 includes an inverter 23 and a negative electricity resistor 24. Similarly to the capacitance accumulation/composition unit 5 in the above-mentioned case, the capacitance accumulation/composition unit 5 also includes a positive accumulator 12, a negative accumulator 22, and the capacitance calculator 7.

The AC voltage generator 13 generates an AC voltage Vo for detecting the stray capacitances of the electrodes. The positive electricity resistor 14 increases an impedance of the voltage generated by the AC voltage generator 13 and supplies the voltage with the increased impedance to the positive element electrode. As a result of the increased impedance, the voltage drops due to a frequency f of the AC voltage, the stray capacitance Cep of the positive element electrode, and a resistance R of the positive electricity resistor 14 as expressed by Equation 4. As a result, a voltage Vep of the positive electrode terminal becomes smaller than the AC voltage Vo. In Equation 4, π is a constant pi.

$$Vep=Vo \div \{(2\times\pi\times f\times Cep\times R)^2+1\}^{0.5} \quad \text{(Equation 4)}$$

The inverter 23 generates an AC voltage in a phase opposite to that of the AC voltage generated by the AC voltage generator. A resistance value of the negative electricity resistor 24 is the same as that of the positive electricity resistor 14. Accordingly, a voltage Vem at the negative electrode terminal similarly drops to the voltage expressed by Equation 5. In Equation 5, Cem is the stray capacitance of the negative element electrode.

$$Vem=Vo \div \{(2\times\pi\times f\times Cem\times R)^2+1\}^{0.5} \quad \text{(Equation 5)}$$

The positive accumulator 12 extracts the voltage Vep at the positive electrode terminal. For this reason, the positive accumulator 12 receives an input of the voltage with a sufficiently high impedance to detect the AC voltage, and then filters the AC voltage to extract a DC component. Similarly, the negative accumulator 22 also extracts the voltage Vem of the negative electrode terminal. The detection and filtering functions for extracting the DC component in the positive accumulator 12 and the negative accumulator 22 correspond to the accumulation of the stray capacitance obtained by the characteristic of the repeated charge and discharge.

After individually calculating the stray capacitance Cep of the positive element electrode and the stray capacitance Cem of the negative element electrode, the capacitance calculator 7 obtains the sum of the two stray capacitances Cep and Cem. In order to obtain the stray capacitance Cep of the positive element electrode and the stray capacitance Cem of the negative element electrode, Equation 4 and 5 are solved in advance respectively for the stray capacitance Cep of the positive element electrode and the stray capacitance Cem of the negative element electrode. Then, the voltage extracted by the positive accumulation unit 12 and the voltage extracted by the negative accumulation unit 22 are respectively assigned to Vep and Vem in the Equation. Since each of the voltage value Vo and the frequency f of the AC voltage generated by the AC voltage generator 13 and the inverter 23 and the resistance values R of the positive electricity resistor 14 and the negative electricity resistor 24 is normally a constant, Equation 4 and 5 solved in advance for the stray capacitance Cep of the positive element electrode and the stray capacitance Cem of the negative element electrode can also be prepared as one-dimensional tables.

Even when the AC voltage is applied, the currents caused by the noise flow in the same direction through the positive element electrode and the negative element electrode, whereas the currents caused by the charge/discharge flow in the opposite directions through the positive element electrode and the negative element electrode. Accordingly, the effects of noise cancel each other by obtaining the composite stray capacitance of the differential electrode.

The example of the stray capacitance detector for applying the AC voltage to charge and discharge the differential electrode has been described above. As in the case where the charge/discharge is performed by switching, even when the differential electrode is charged and discharged by the application of the AC voltage, only a subtle increase in stray capacitance, which is caused by the approach of the object and is obtained by removing the stray capacitance of the differential electrode itself, can be extracted to be detected at high accuracy. A method thereof will now be described referring to FIG. 20.

Figure 20:
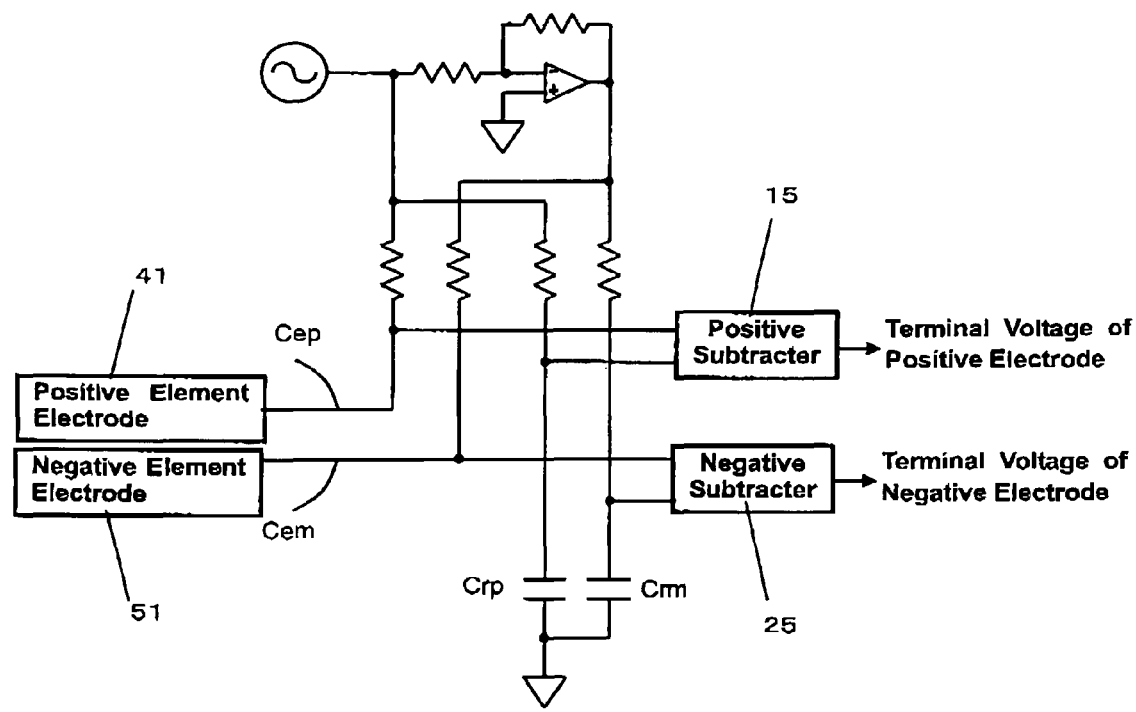
FIG. 20 is another connection diagram illustrating the differential charger/discharger according to the present invention.

In FIG. 20, the capacitor Crp has the same value of the electrostatic capacitance as that of the stray capacitance when no object is approaching the positive element electrode, and is connected to the AC voltage generator through an electric resistance having the same value as the resistance value of the positive electric resistance. Positive subtracter 15 subtracts the voltage of the capacitor Crp from the voltage Vep of the positive element electrode to output the AC voltage corresponding to an increase in the apparent stray capacitance of the positive element electrode, which is caused by the approach of the object, as a positive electrode terminal voltage.

Similarly, the capacitor Crm and a negative subtracter 25 output the AC voltage corresponding to an increase in the apparent stray capacitance of the negative element electrode, which is caused by the approach of the object, as a negative electrode terminal voltage.

Figure 18:
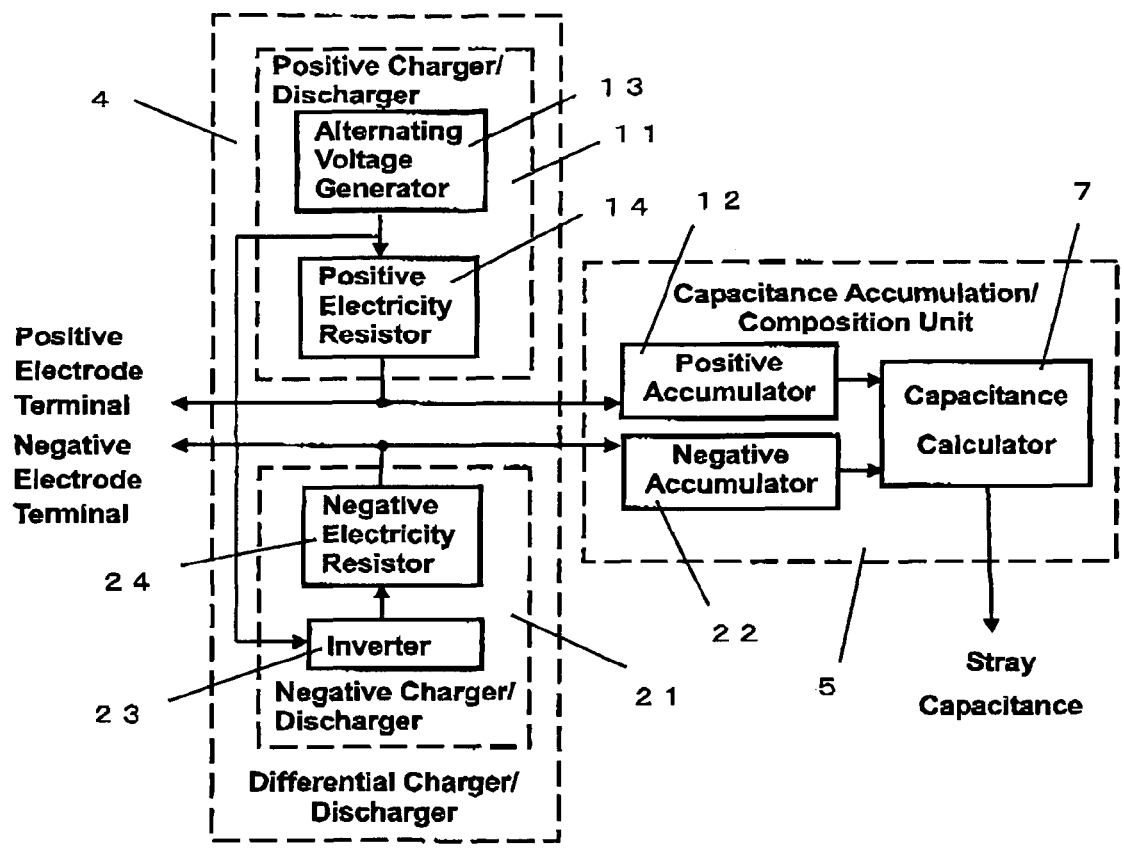
FIG. 18 is a block diagram illustrating the stray capacitance detector according to the present invention.
Figure 19:
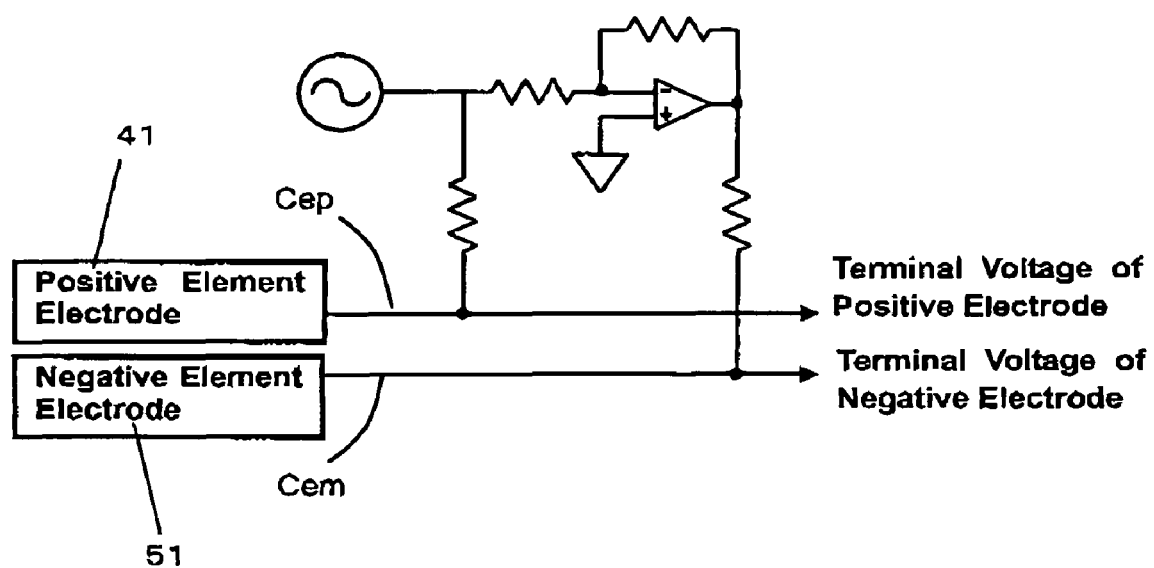
FIG. 19 is a connection diagram illustrating differential charger/discharger according to the present invention.

The thus obtained positive electrode terminal voltage and negative electrode terminal voltage are respectively input to the positive accumulation unit 12 and the negative accumulation unit 22 of the capacitance accumulation/composition unit 5 illustrated in FIG. 18 to obtain a change in stray capacitance of the differential electrode.

Figure 21:
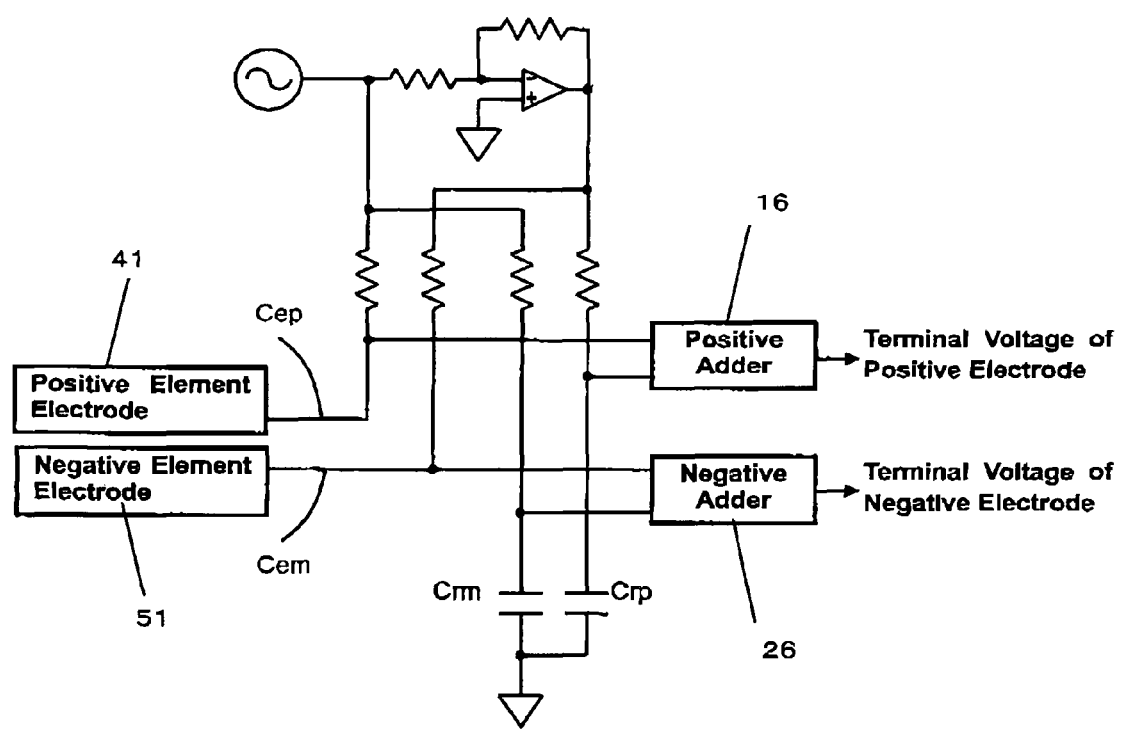
FIG. 21 is still another connection diagram illustrating the differential charger/discharger according to the present invention.

In the example illustrated in FIG. 20, the AC voltages in the same phase are respectively applied to the capacitor Crp and the positive element electrode, and then the voltage of the capacitor Crp is subtracted from the voltage Vep of the positive element electrode to cancel the stray capacitance of the positive element electrode itself. Alternatively, as illustrated in FIG. 21, even if the AC voltages in the opposite phases are respectively applied to the capacitor Crp and the positive element electrode and then the voltage of the capacitor Crp and the voltage Vep of positive element electrode are added, the same effects can be obtained. The same is applied to the capacitor Crm and the negative element electrode. In this case, the positive subtracter and the negative subtracter in FIG. 20 are respectively replaced by positive adder 16 and negative adder 26.

Figure 22:
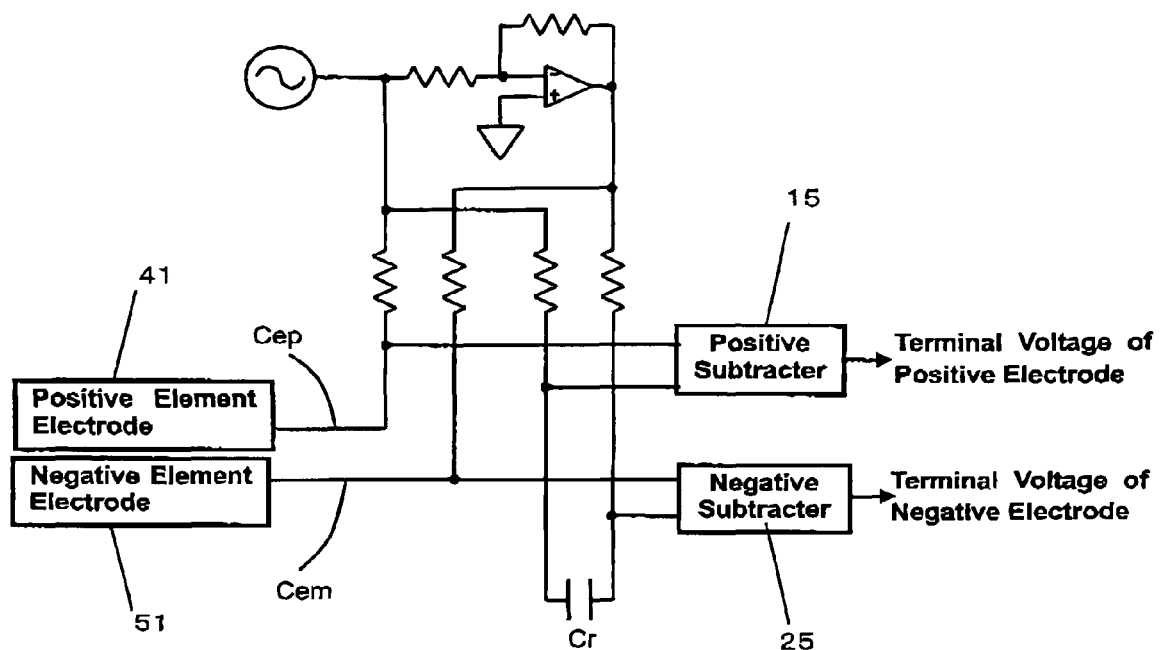
FIG. 22 is still another connection diagram illustrating the differential charger/discharger according to the present invention.
Figure 23:
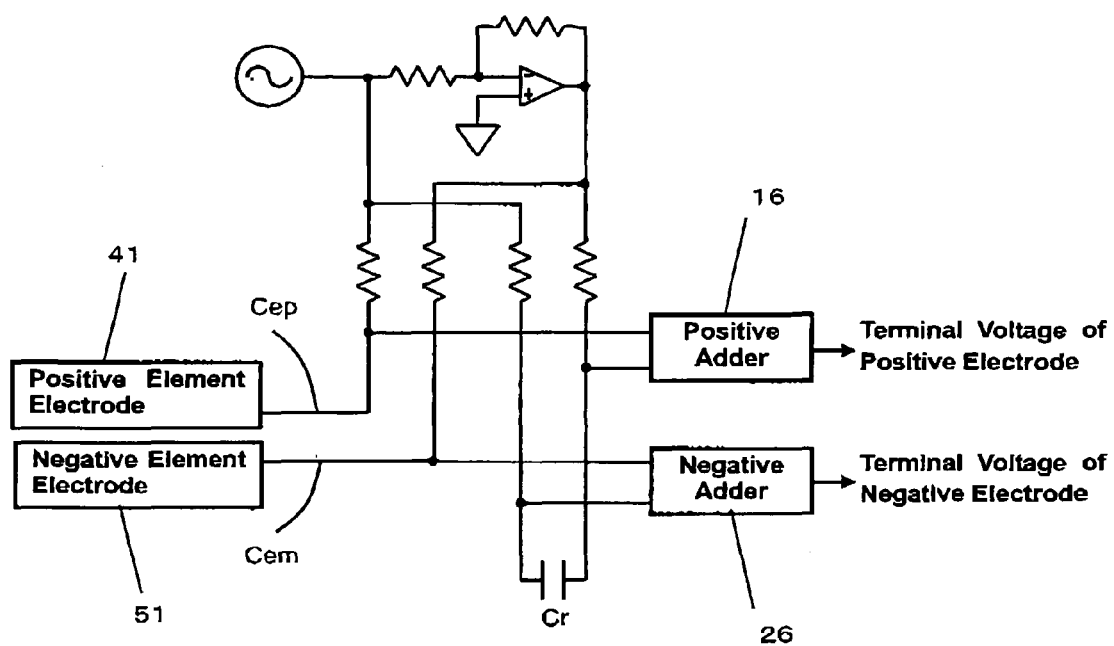
FIG. 23 is still another connection diagram illustrating the differential charger/discharger according to the present invention.

Moreover, as illustrated in FIGS. 22 and 23, when the stray capacitance of the positive element electrode and that of the negative element electrode are substantially equal to each other in the case where no object is approaching, substantially the same effects can be obtained by combining the capacitor Crp and the capacitor Crm in FIGS. 20 and 21 into a single capacitor Cr.

The examples of the stray capacitance detector 2 in the case using switching and the case using the application of the AC voltage have been described above. However, any means can be used as the stray capacitance detector as long as the means causes the currents in the opposite phases to flow through the positive element electrode and the negative element electrode of the differential electrode to obtain the composite value of the stray capacitances of the differential electrode from the characteristic thereof.

Similarly, in a stray capacitance detecting step, the stray capacitance of the differential electrode, which is changed by the approach of the object, is detected. For this purpose, the stray capacitance detecting step is realized by a differential charge/discharge step for repeatedly charging and discharging the differential electrode, and a capacitance accumulating/combining step for accumulating a characteristic of the charge/discharge to convert the accumulated characteristic into the stray capacitance.

The proximity calculator 3 detects the approach of the presupposed object when the exact value of the stray capacitance obtained by the stray capacitance detector becomes larger than a preset value. Accordingly, the proximity calculator 3 is capable of performing a precise detection with little noise effect. As the method of detecting the approach and the position of the object from the value of the stray capacitance, various methods are known. Any means can be used as the proximity calculator 3 as long as the means detects the approach and the position of the object based on the stray capacitance.

Similarly, in a proximity computation step, when the exact value of the stray capacitance obtained in the stray capacitance detecting step becomes larger than a preset value, the approach of the presupposed object is accurately detected.

The examples of the proximity detector and the proximity detecting method according to the present invention have been described above. Since any device or method can obtain the exact stray capacitance with the noise being removed as long as the device or the method charges and discharges the positive element electrode and the negative element electrode of the differential electrode in the opposite phases and performs a calculation to obtain the composite value of the stray capacitances of the positive element electrode and the negative element electrode of the differential electrode during the stray capacitance detection, such a device or method can accurately detect the approach of the object.

Second Embodiment

In the first embodiment, the proximity detector including the single differential electrode to detect the approach of the object has been described. In the second embodiment a proximity detector which is able to detect not only the approach of the object but also the position of the object by the use of a plurality of differential electrodes will be described.

Figure 24:
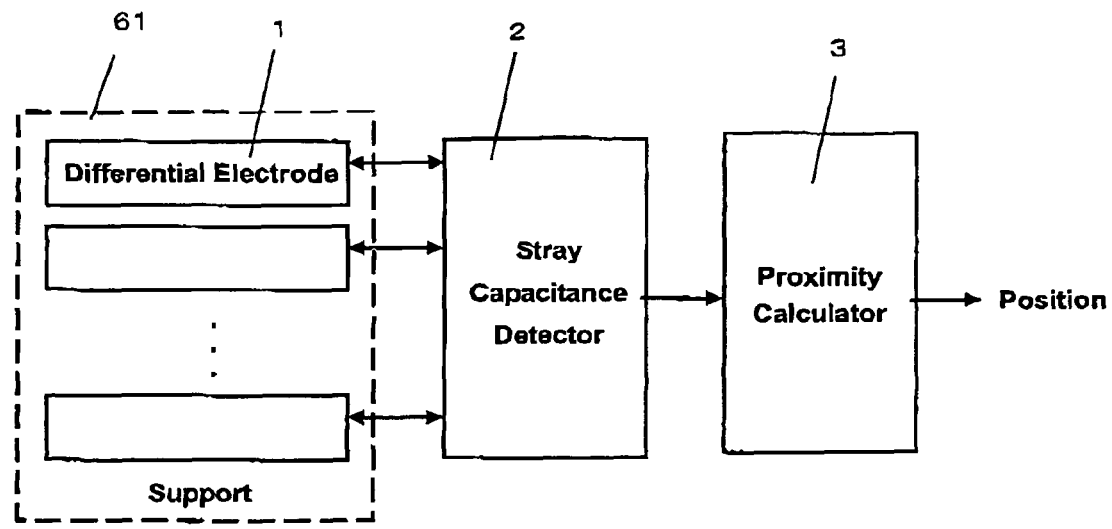
FIG. 24 is a block diagram illustrating a second embodiment of the proximity detector according to the present invention.

For this purpose, in the second embodiment, as illustrated in FIG. 24, the proximity detector includes a plurality of the differential electrodes 1 supported by support 61, the stray capacitance detector 2 for detecting each of the stray capacitances of the plurality of differential electrodes, and the proximity calculator 3 for computing the approach and the position of the object based on the positions of the plurality of differential electrodes and each of the stray capacitances of the plurality of differential electrodes obtained by the stray capacitance detector 2.

Hereinafter, each constituent component will be described in detail below.

Figure 25:
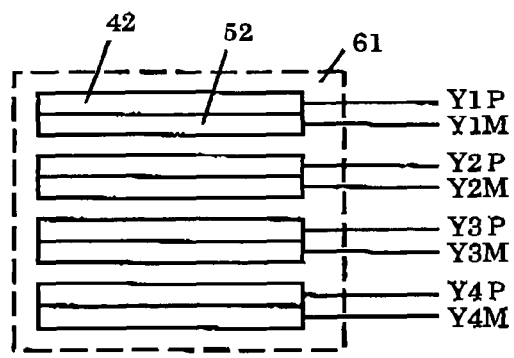
FIG. 25 is a drawing illustrating a differential electrode arrangement according to the present invention.

In FIG. 25, the differential electrodes 1 are arranged in the support 61 at equal intervals in a uniaxial detection direction (vertical direction in FIG. 25). Although four differential electrodes 1 are provided in FIG. 25 for convenience, the number of the differential electrodes 1 is not limited thereto. Each of the four differential electrodes 1 includes a positive element electrode 42 and a negative element electrode 52. Each of the four positive element electrodes 42 and the four negative element electrodes 52 has the same shape and the same characteristic.

The stray capacitance detector, which is the same as that described in the first embodiment for each of the four differential electrodes, is used as the stray capacitance detector 2 to detect the stray capacitance of each of the four differential electrodes 1. It is apparent that a part of the circuit which can be commonly used in a time division manner can be shared to reduce the circuit scale.

The proximity calculator 3 detects the approach and the position of the object based on the stray capacitance of each of the differential electrodes 1, which is detected by the stray capacitance detector 2.

Although the proximity calculator 3 detects the approach of the object when any of the stray capacitances of the differential electrodes 1 becomes larger than a predetermined value in this embodiment, the detection of the object is not limited thereto.

After the approach of the object is detected, the position is obtained. As the position, the position of the differential electrode having the largest stray capacitance may be obtained as the detected position of the approaching object. The amount of correction may, further, be added to increase the accuracy of the detected position. For the amount of correction for this purpose, for example, a two-dimensional correction amount table is referred to with a value obtained by dividing the stray capacitance of the differential electrode provided on the differential electrode having the largest stray capacitance and the stray capacitance of the differential electrode provided below the differential electrode having the largest stray capacitance by the largest stray capacitance and normalizing the result of division. It is sufficient to store values predetermined by experiments in the two-dimensional correction amount table used in this case.

Besides the above-mentioned example, any means may be used as the proximity calculator 3 as long as the proximity calculator 3 can obtain the approach and the position of the object from the positions and the stray capacitances of the plurality of differential electrodes 1.

As described above, the proximity detector according to the present invention includes the plurality of differential electrodes 1 arranged in the detection direction to be able to detect the approach and the position of the object with the effects of noise being removed.

The proximity detector including the plurality of differential electrodes 1 arranged in the uniaxial detection direction to be able to detect the approach of the object and the exact position in the detection direction has been described above. A proximity detector having two axial detection directions will now be described.

As in the case of the proximity detector having the uniaxial detection direction described above, the proximity detector having the two axial detection directions includes a plurality of the differential electrodes 1, the stray capacitance detector 2 for detecting the stray capacitance of each of the plurality of the differential electrodes, and the proximity calculator 3 for computing the approach and the position of the object from the positions of the plurality of differential electrodes and the stray capacitance of each of the differential electrodes obtained by the stray capacitance detector 2.

Figure 26:
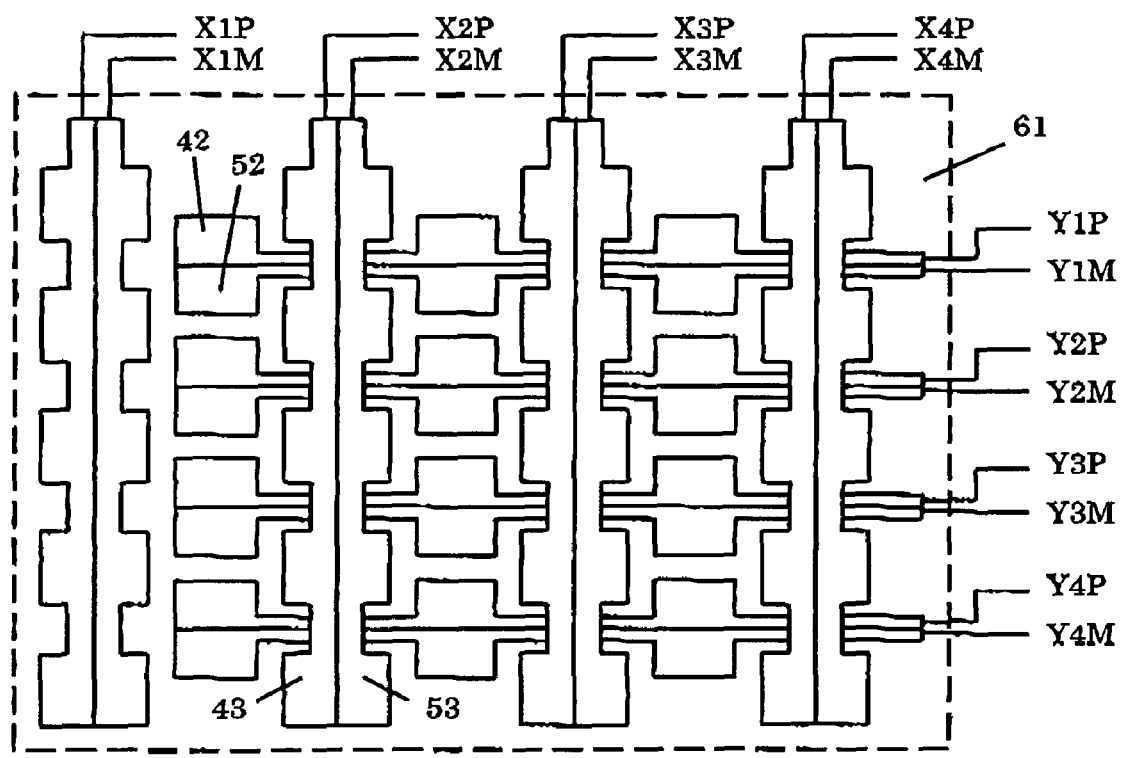
FIG. 26 is another drawing illustrating a differential electrode arrangement according to the present invention.

As the plurality of differential electrodes 1 in the two axial directions, for example, as illustrated in FIG. 26, two pairs of differential electrodes, each being arranged in one axial direction (a pair of the positive element electrode 42 and the negative element electrode 52 for detecting the position in a vertical direction and another pair of a positive element electrode 43 and a negative element electrode 53 for detecting the position in a horizontal direction), are overlapped through an insulating layer to perpendicularly cross their detection directions. Moreover, a width of the intersection of the differential electrodes is reduced to prevent the differential electrodes from interfering each other.

Figure 28:
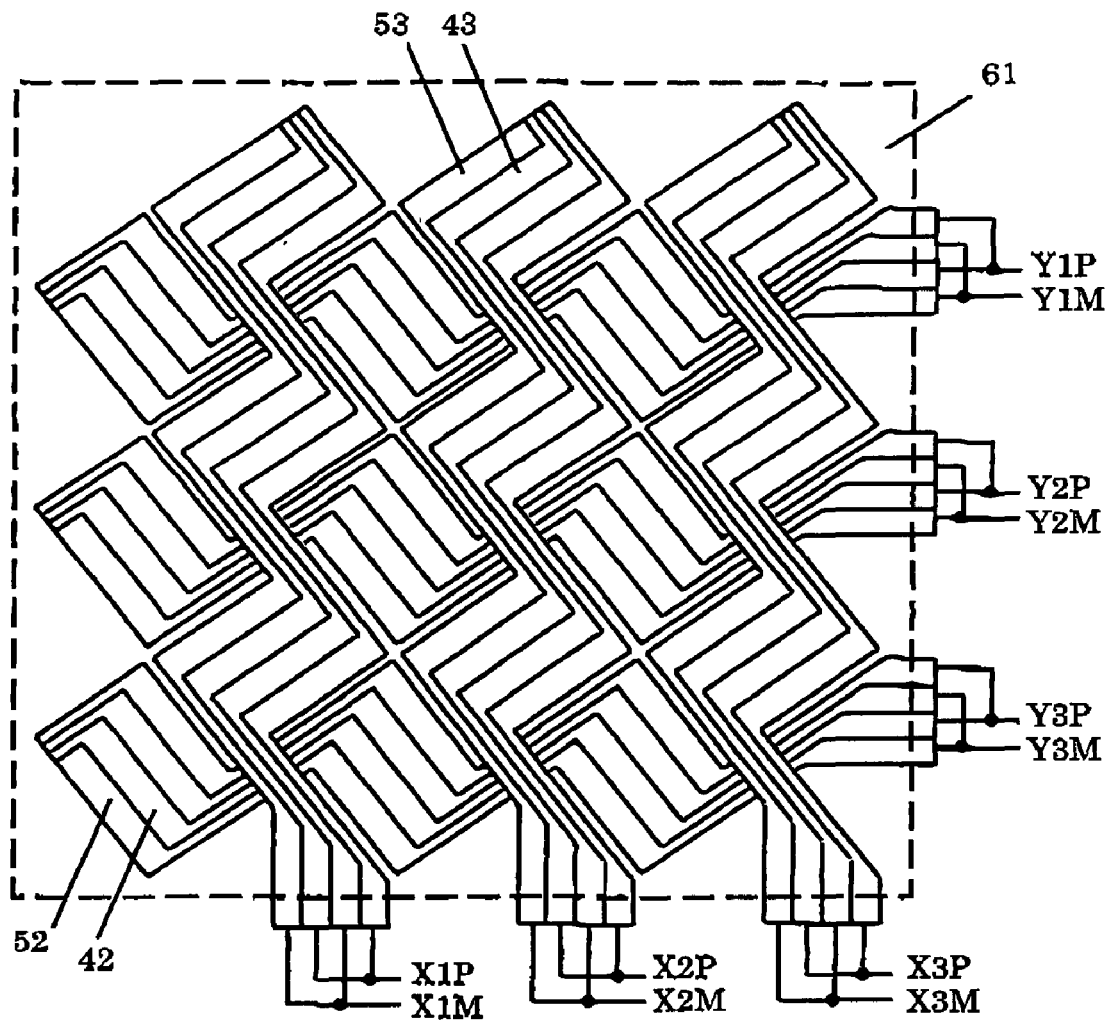
FIG. 28 is still another drawing illustrating a differential electrode arrangement according to the present invention.

In this case, by arranging the element electrodes in a zigzag pattern as illustrated in FIG. 28, the proximity detector is less susceptible to the effects of noise even when the proximity detector is provided to overlap on the display device driven by the line-sequential system.

The stray capacitance detector 2 obtains the stray capacitance of each of the plurality of differential electrodes arranged in the two axial directions in the same manner as in the case where the plurality of differential electrodes is arranged in the uniaxial direction.

The proximity calculator 3 detects the approach of the presupposed object when the largest stray capacitance of the stray capacitances of the plurality of differential electrodes arranged in the two axial directions, which are obtained by the stray capacitance detector 2, becomes larger than a predetermined value. The position of the object is obtained for each of the two axial detection directions by the same method as that in the case of the uniaxial direction.

As described above, the plurality of differential electrodes are arranged in the two axial detection directions in the proximity detector according to the present invention. As a result, the proximity detector can detect the approach and the two-dimensional position of the object with the effects of noise being removed.

The methods of arranging the plurality of differential electrodes in the uniaxial detection direction and the two axial detection directions have been described with examples. In the same manner, the plurality of differential electrodes can be arranged in multiple axial detection directions to allow the detection of multi-axial position of the object.

The proximity detector for obtaining the stray capacitance for each of the differential electrodes has been described above. Next, a method of systematically grouping the plurality of differential electrodes and obtaining the stray capacitance for each group to obtain the position of the approach of the object without increasing the whole scale will be described. A method of arranging and grouping the plurality of differential electrodes in such a case will be described referring to FIG. 27.

Figure 27:
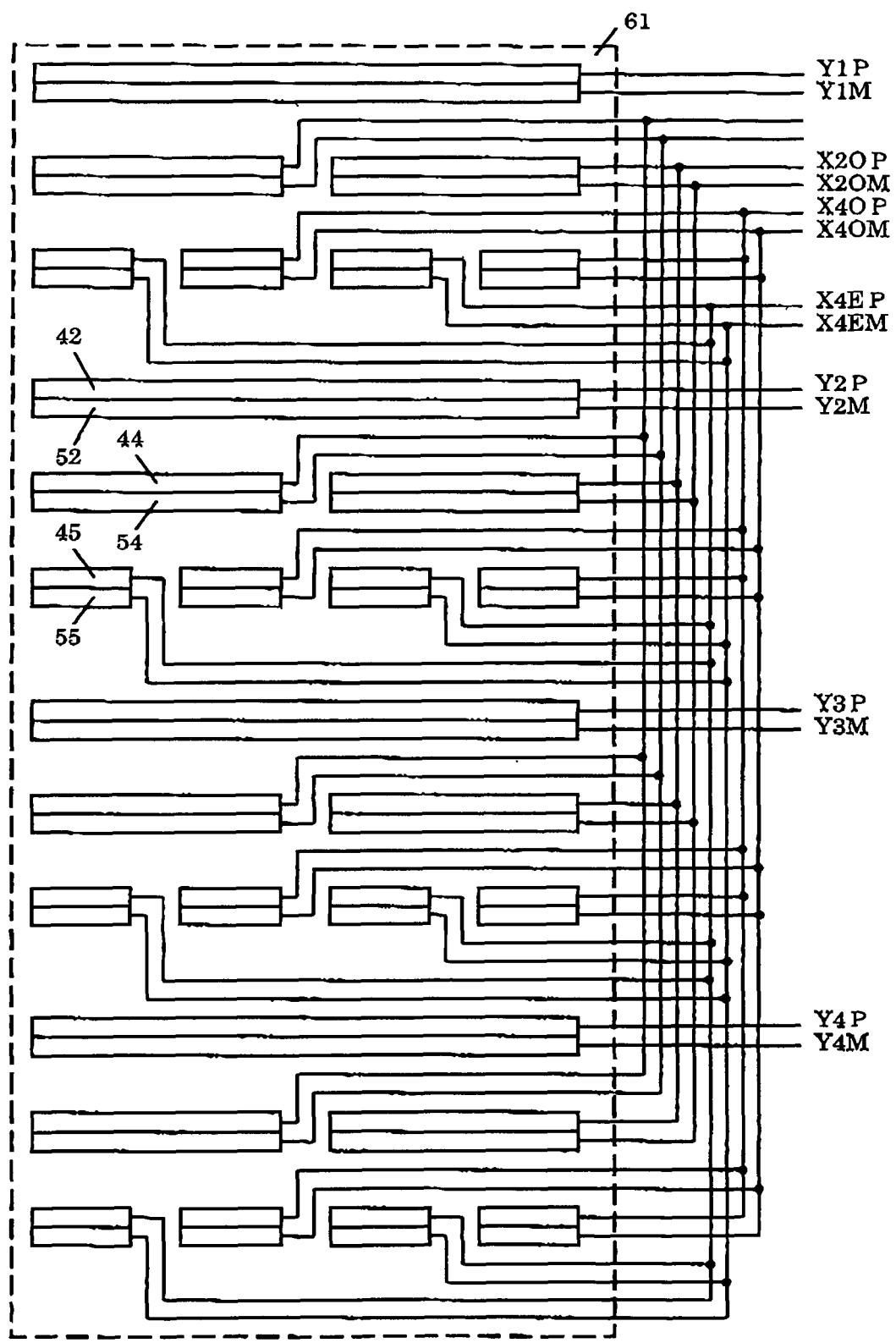
FIG. 27 is still another drawing illustrating a differential electrode arrangement according to the present invention.

In FIG. 27, as the plurality of differential electrodes which include the positive element electrode 42 and the negative element electrode 52 and are provided to extend throughout the horizontal direction, the same element electrodes are arranged at equal intervals in the detection direction corresponding to the vertical direction in FIG. 27 as in the case where the differential electrodes are arranged in the uniaxial detection direction described above. Based on the stray capacitance of each of the differential electrodes, the vertical position of the approaching object can be obtained.

On the other hand, a plurality of differential electrodes (a positive element electrode 44 and a negative element electrode 54) arranged to halve the horizontal direction are provided to detect whether the approaching object is positioned in the right half or the left half of the range of detection. For example, the plurality of differential electrodes provided in the left half are gathered into the same group. The positive element electrodes in the same group are connected to one electrode terminal, whereas the negative element electrodes in the same group are connected to another electrode terminal. The plurality of differential electrodes arranged in the right half are grouped and connected in the same manner.

Similarly, a plurality of differential electrodes (a positive element electrode 45 and a negative element electrode 55) are arranged to divide the horizontal direction into four. Each section obtained by this division is obtained by halving the right half and the left half (hereinafter, referred to as the first right half and the first left half), which are obtained by halving the horizontal direction with the positive element electrode 44 and the negative element electrode 54. The plurality of differential electrodes is gathered into two groups. One group is formed by the plurality of differential electrodes in the right half of each of the first right half and the first left half, whereas another group is formed by the plurality of differential electrodes in the left half of each of the first right half and the first left half. The positive element electrodes in the same group are connected to one electrode terminal, whereas the negative element electrodes in the same group are connected to another electrode terminal.

In this case, as a method of obtaining the position in the horizontal direction by the proximity calculator 3, it is discovered that the object is positioned in any of the first right half and the first left half, which has a larger stray capacitance when the stray capacitance corresponding to the first right half and that corresponding to the first left half are compared with each other. Further, by the comparison between the stray capacitances of the right half and the left half of the first right half or the first left half, it can be detected that the object is positioned in the right half and the left half of each first half.

Instead of simply comparing the stray capacitances, a table obtained by experiments is referred to with a ratio of the stray capacitances to make a correction as in the case of the uniaxial detection direction. As a result, a more accurate detection can be performed.

Further, although the case where the horizontal direction is divided into four has been described above, a more accurate detection can be performed by dividing the horizontal direction into a larger number of sections.

As described above, a large number of differential electrodes are required to detect the position in the multi-axial directions with the electrodes in one layer. If the differential electrodes are not grouped, the scale of the stray capacitance detector 2 or the proximity detector provided subsequent to the electrode terminals becomes larger substantially in proportion to the number of differential electrodes. However, the proximity detector including the grouped differential electrodes can accurately detect the multi-axial position of the approach of the object without greatly increasing the whole scale.

As in the case of the first embodiment, when the proximity detector is used on the display device driven by the line-sequential system, the effects of noise can be reduced even in the second embodiment by setting the direction of the element electrodes not to be parallel to the line direction of the line-sequential driving. Accordingly, even when the detection direction of the other axis is not orthogonal to the detection direction, the position on an orthogonal coordinate can be easily obtained by transforming an oblique coordinate into the orthogonal coordinate by a CPU or the like.

Third Embodiment

In the second embodiment, the proximity detector for obtaining the composite capacitance of the positive element electrode and the negative element electrode of the differential electrode from the characteristic of the differential charge/discharge to detect the stray capacitance with the noise being removed to accurately detect the approach and the position of the object has been described. In such a case, however, one pair of the positive element electrode and the negative element electrode of the differential electrode is required to obtain the electrostatic capacitance for one position. Accordingly, the number of required electrodes is doubled as compared to a conventional simple measurement of the stray capacitance, resulting in increase of the detection circuit scale.

Thus, in the third embodiment, a proximity detector for obtaining the electrostatic capacitance of each of the closely arranged electrodes constituting the differential electrode, while removing the noise to accurately detect the approach and the position of the object without notable increase in the number of electrodes and in the scale of the detection circuit, will be described.

Figure 29:
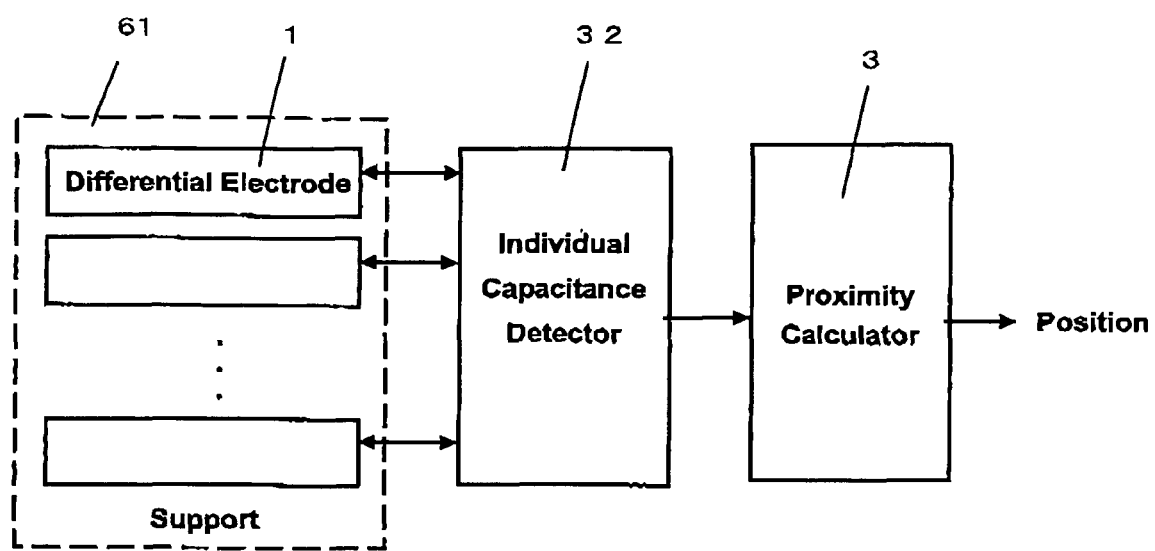
FIG. 29 is a block diagram illustrating a third embodiment of the proximity detector according to the present invention.

In this third embodiment, as illustrated in FIG. 29, the proximity detector includes the plurality of differential electrodes 1 on the support 61, individual capacitance detector 32 for detecting the stray capacitance of each of the element electrode having the positive attribute and the element electrode having the negative attribute constituting each of the plurality of differential electrodes 1, and the proximity calculator 3 for detecting the approach and the position of the object. As the proximity calculator 3, the same means as that in the second embodiment can be used. Hereinafter, the differential electrode 1 and the individual capacitance detector 32 will be described in detail.

Figure 30:
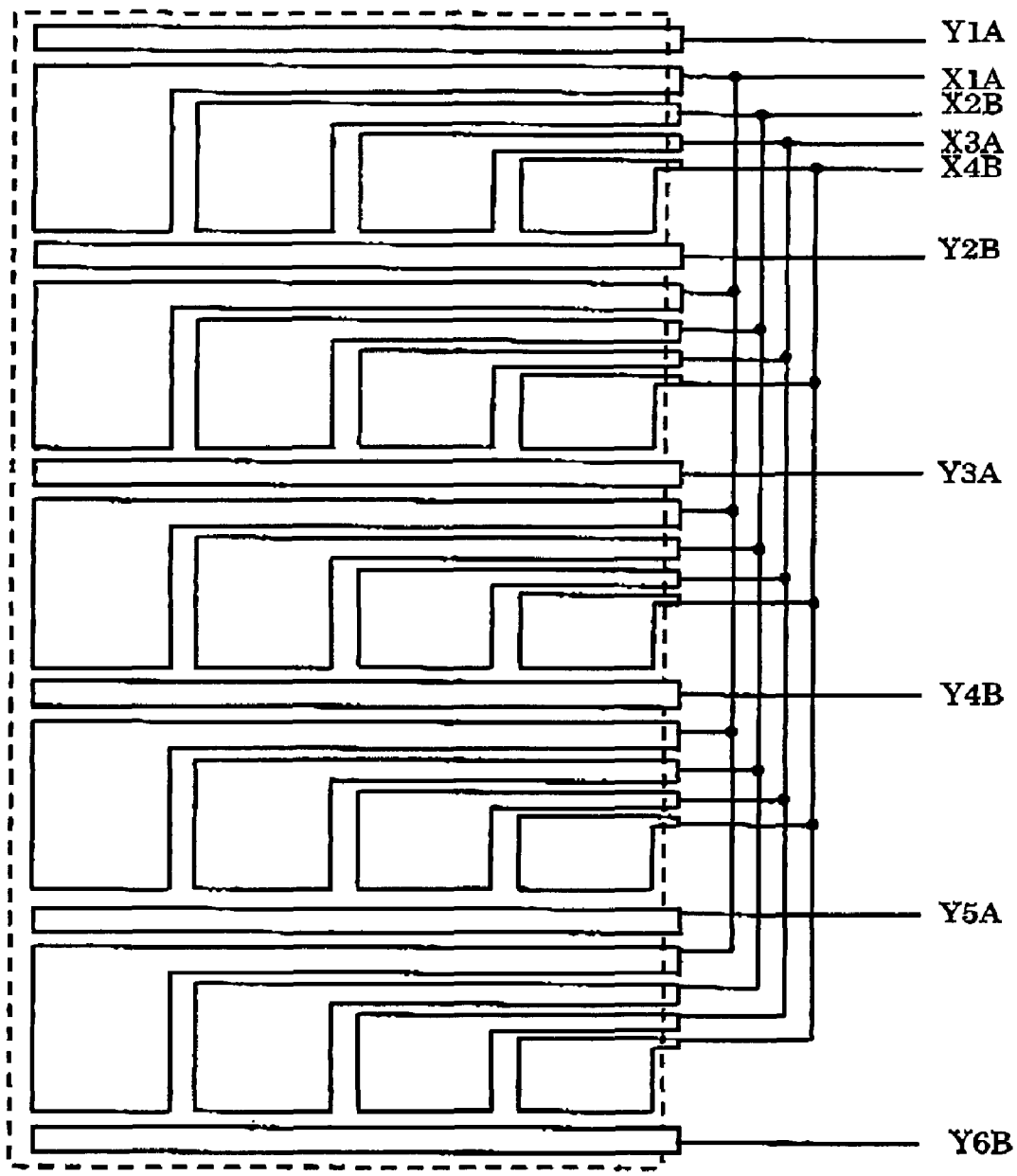
FIG. 30 is a structure view illustrating an example of arrangement of the differential electrodes according to the third embodiment of the present invention.

The differential electrode 1 detects the approach and the position of the object as a change in stray capacitance. For example, when the position in two directions, that is, an X-axis direction and a Y-axis direction is to be detected, a plurality of electrodes corresponding to a biaxial coordinate having the Y-axis in the vertical direction and the X-axis in the horizontal direction are provided on the support 61 without crossing each other, as illustrated in FIG. 30.

On the Y-axis, electrodes connected to electrode terminals Y1A, Y2B, Y3A, Y4B, Y5A, and Y6B for the respective Y-coordinate units are provided at equal intervals. The differential electrodes 1 are respectively connected to the electrode terminals Y1A and Y2B, the electrode terminals Y3A and Y4B, and the electrode terminals Y5A and Y6B. The differential electrode 1 serves to detect the electrostatic capacitance of each of the differential electrodes. In this case, the element electrodes constituting the pair of differential electrodes are positioned to be separate from each other by one coordinate unit. However, because each of the element electrodes having substantially the same shape is arranged on the same substrate, the element electrodes are affected by substantially the same degree of noise.

Similarly, on the X-axis, electrodes connected to electrode terminals X1A, X2B, X3A, and X4B for the respective X-coordinate units are provided at equal intervals. The differential electrodes are respectively connected to the electrode terminals X1A and X2B and the electrode terminals X3A and X4B. The differential electrode 1 serves to detect the electrostatic capacitance of each of the differential electrodes. In this case, the element electrodes constituting the pair of differential electrodes are positioned to be separate from each other by one coordinate unit. However, because each of the element electrodes having substantially the same shape is arranged on the same substrate, the element electrodes are affected by substantially the same degree of noise.

Since the support 61 requires a certain amount of area to operate and fabrication cost increases if the electrodes are arranged to cross each other, the electrodes on the X-axis are divided by the electrodes on the Y-axis on the support 61. Alternatively, the electrodes on the same X-coordinate are connected in parallel for the wiring to the electrode terminals.

Accordingly, a pattern for wiring the electrodes on the X-axis on the support 61 passes through another X-coordinate. For example, because a wiring pattern for connection to the electrode terminal X2B passes through the X-coordinates corresponding to the electrode terminals X3A and X48 on the support 61, the electrostatic capacitance detected from the electrode terminal X2B increases even when a finger approaches the electrode terminal X3A or X4B. In order to remove the effects of the increase in electrostatic capacitance, for example, when the approach of the object is detected on the X-coordinate corresponding to the electrode terminal X2B, an increase in electrostatic capacitance of the wiring pattern of the electrode terminals X1A, X2B, and X3A is supposed from the X-coordinate and the Y-coordinate to be removed from the detected electrostatic capacitance.

The electrode on the X-axis formed in a wedge-like shape or the divisional coding of the coordinates as illustrated in FIG. 27 can be used to normally reduce the number of electrode terminals. In this third embodiment, however, when, for example, two fingers simultaneously approach, the electrode is arranged for each coordinate to detect the center or even the distance between the two positions.

Figure 31:
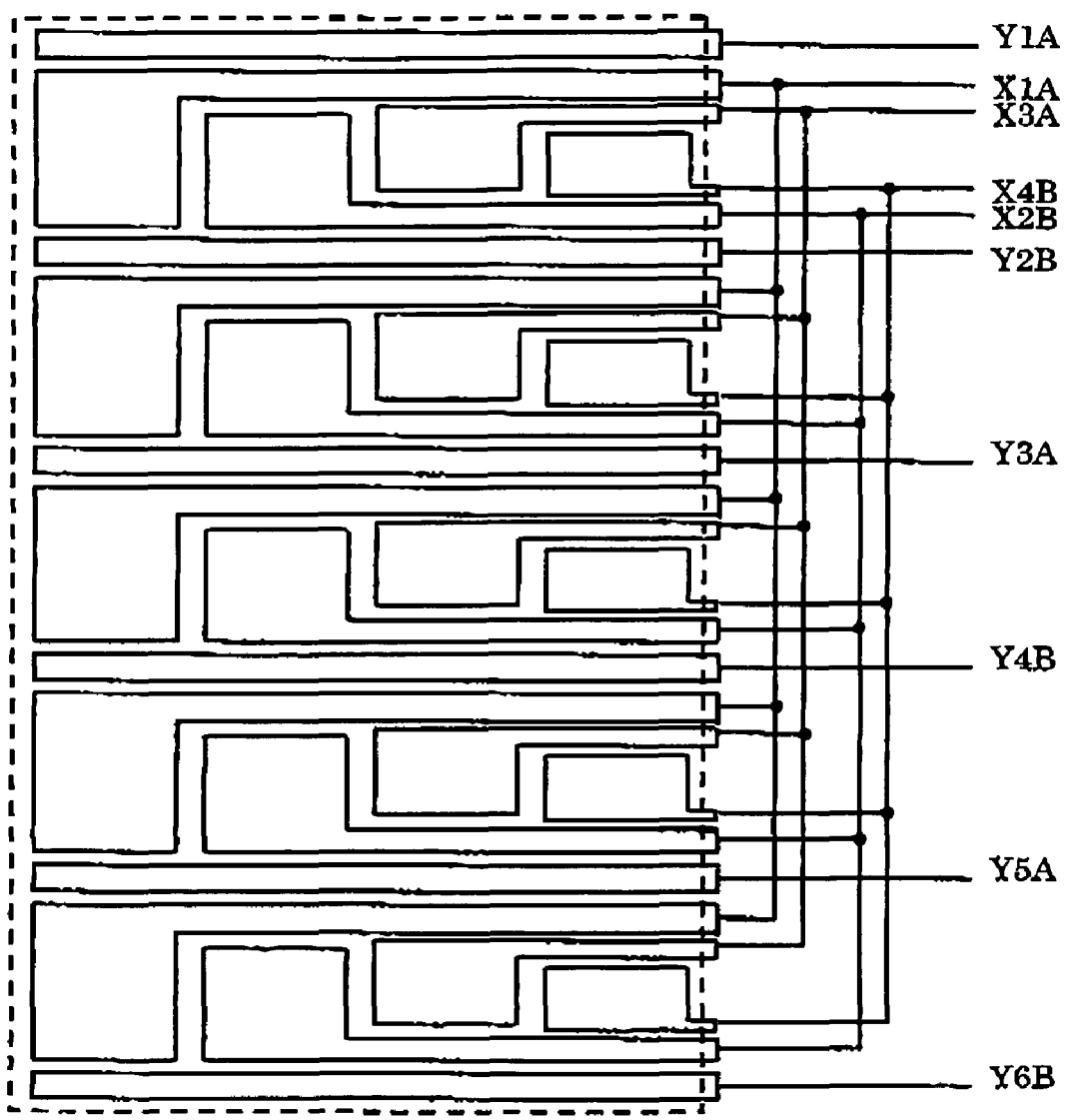
FIG. 31 is a structure view illustrating another example of the arrangement of the differential electrodes according to the third embodiment of the present invention.

Further, by arranging the electrodes driven in the same phase closer to each other, the area on the support 61 can be more effectively used. For example, in the case illustrated in FIG. 31, since the electrodes corresponding to the electrode terminals X1A and X3A are simultaneously driven in the same phase, a gap between the patterns can be reduced. The electrodes corresponding to the electrode terminals X2B and X4B are arranged and driven in the same manner. Since transfer of the electric charges between the electrodes simultaneously driven in the same phase is small, the electrostatic capacitance between the patterns is scarcely added to the detected electrostatic capacitance.

Figure 32:
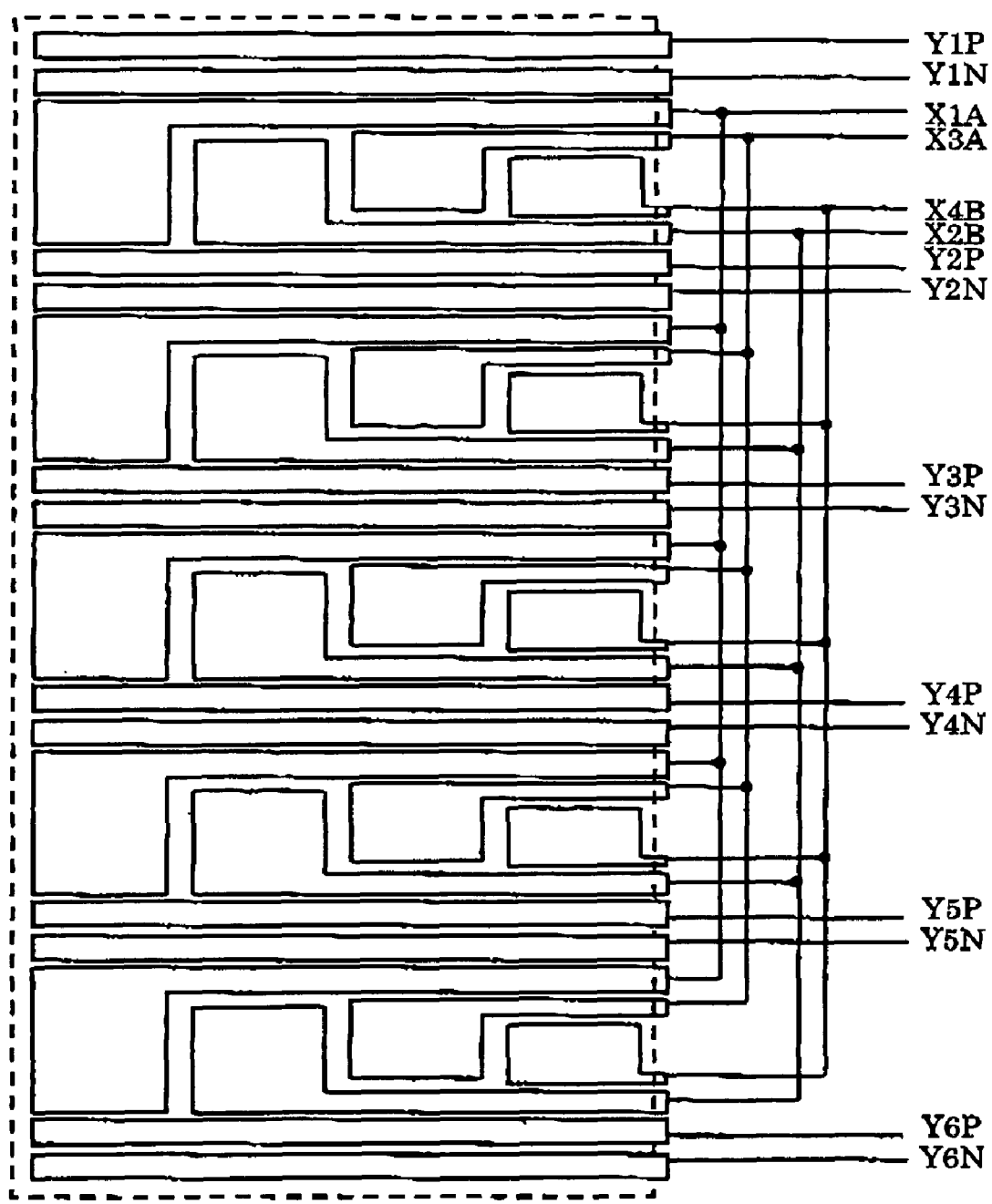
FIG. 32 is a structure view illustrating still another example of the arrangement of the differential electrodes according to the third embodiment of the present invention.

Moreover, as illustrated in FIG. 32, the sum of the positive electric capacitances of the differential electrode may be detected in the same manner as in the second embodiment for the Y-direction, whereas an individual electrostatic capacitance may be obtained only for the X-direction. The same is applied to the reverse case.

Figure 33:
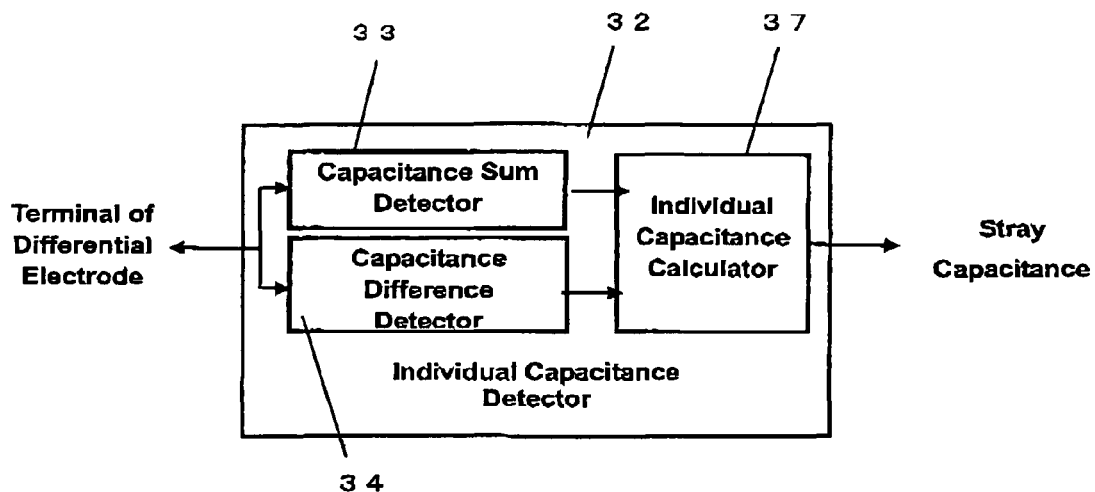
FIG. 33 is a block diagram illustrating individual capacitance detector according to the present invention.

As illustrated in FIG. 33, the individual capacitance detector 32 includes capacitance sum detector 33, capacitance difference detector 34, and individual capacitance calculator 37. The capacitance sum detector 33 detects the sum obtained by adding the electrostatic capacitances of the positive element electrode and the negative element electrode of the differential electrode, as in the case of the stray capacitance detector 2 in the second embodiment. Thus, each of the capacitance difference detector 34 and the individual capacitance calculator 37 will be described in detail below.

Figure 34:
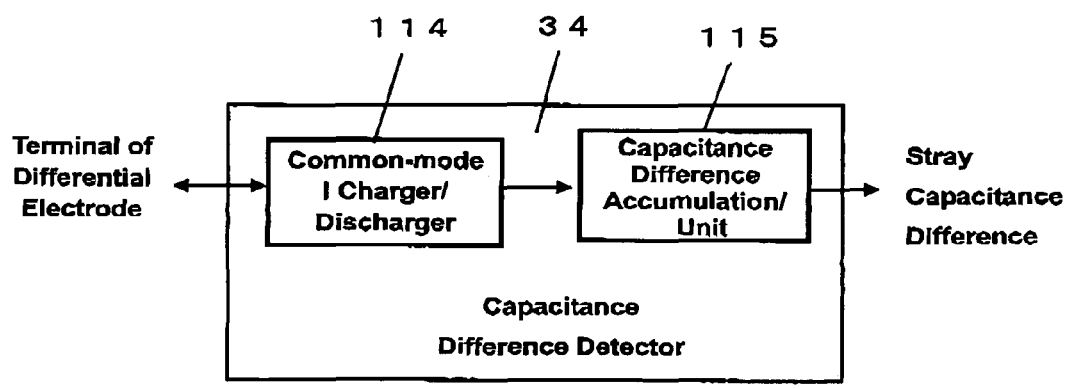
FIG. 34 is a block diagram illustrating capacitance difference detector according to the present invention.

Since the capacitance difference detector 34 detects a difference between the electrostatic capacitances of the element electrodes of the differential electrode while removing the noise, the capacitance difference detector 34 includes common-mode charger/discharger 114 and capacitance difference accumulation unit 115 as illustrated in FIG. 34.

The common-mode charger/discharger 114 charges and discharges the electrodes constituting the differential electrode in the same phase.

The capacitance difference accumulation unit 115 accumulates a characteristic of the charge/discharge for a plurality of times in the common-mode charger/discharger 114, and detects the electrostatic capacitances of the positive and negative electrodes constituting the differential electrodes to obtain a difference between the electrostatic capacitances. For this purpose, for example, a calculation represented by Equation 6 is performed. Besides, any method such as that using a table may be used as long as a value corresponding to a difference between the electrostatic capacitances is obtained.

(Difference between electrostatic capacitances)–
(Electrostatic capacitance of the positive electrode)–(Electrostatic capacitance of the negative electrode) (Equation 6)

Since application of the same degree of noise to the positive electrode and the negative electrode constituting the differential electrodes causes similar effect to the detections of the electrostatic capacitances of the positive electrode and the negative electrode, the effects of noise can be cancelled by obtaining a difference by subtraction.

The capacitance difference detector 34 is not limited to the above case. Any step or means for obtaining a value corresponding to a difference between the electrostatic capacitances of the positive electrode and the negative electrode constituting the differential electrode from the characteristic of the charge/discharge in the same phase may be used.

The individual capacitance calculator 37 calculates a value corresponding to each of the electrostatic capacitances of the positive electrode and the negative electrode constituting the differential electrodes from the value detected by the capacitance sum detector 33, which corresponds to the sum of the electrostatic capacitances of the positive electrode and the negative electrode constituting the differential electrode, and the value detected by the capacitance difference detector 34, which corresponds to the difference between the electrostatic capacitances of the positive electrode and the negative electrode constituting the differential electrode. Accordingly, for example, as expressed by Equation 7, a result obtained by adding the sum of the electrostatic capacitances to the difference between the electrostatic capacitances can be divided by 2 to obtain the electrostatic capacitance of the positive electrode, whereas a result obtained by subtracting the difference between the electrostatic capacitances from the sum of the electrostatic capacitances can be divided by 2 to obtain the electrostatic capacitance of the negative electrode.

(Electrostatic capacitance of the positive electrode)={
(Sum of the electrostatic capacitances)+(Difference between the electrostatic capacitances)}÷2

(Electrostatic capacitance of the negative electrode)={
(Sum of the electrostatic capacitances)–(Difference between the electrostatic capacitances)}÷2 (Equation 7)

Besides, any method such as that using a table may be used as long as the electrostatic capacitances of the positive electrode and the negative electrode are obtained from the sum of the electrostatic capacitances and the difference between the electrostatic capacitances.

Since thus obtained value of the electrostatic capacitance of each of the positive electrode and the negative electrode is calculated from the sum of the electrostatic capacitances with the noise being removed and the difference between the electrostatic capacitances with the noise being removed, the obtained value is a value from which the effects of noise are removed.

The individual capacitance calculator has been described for one pair of the positive element electrode and the positive element electrode of differential electrode. However, it is apparent that the number of required steps and means corresponds to the number of pairs of the positive element electrode and the positive element electrode of differential electrodes.

The individual capacitance detector and the proximity calculator 3 described above can be realized by a general-purpose programmable device. The fabrication cost tends to depend on the number of electrode terminals.

As described above, in the third embodiment, the electrostatic capacitance of each of the differential electrodes can be obtained with the noise being removed, from the sum of the electrostatic capacitances, which is obtained by removing the noise from the charge/discharge characteristics in the opposite phases, and the difference between the electrostatic capacitances, which is obtained by removing the noise from the charge/discharge characteristics in the same phase. The proximity detector capable of detecting the exact approach or position of the object, from which the noise is removed, can thus be realized without increasing the number of electrodes or electrode terminals.

What is claimed is:

1. A proximity detector for detecting approach of an object based on a stray capacitance, the proximity detector comprising:

at least one differential electrode having an apparent stray capacitance that varies in response to an approaching object, the at least one differential electrode comprising a pair of electrodes having a positive element electrode and a negative element electrode;

an individual capacitance detector for detecting an individual stray capacitance of the differential electrode based on stray capacitances of the pair of electrodes obtained by repeatedly charging and discharging the pair of electrodes at the same time in opposite phases, and by repeatedly charging and discharging the pair of electrodes at the same time in the same phase; and a proximity calculator for detecting the approach of the object based on the detected individual stray capacitance;

wherein the individual capacitance detector comprises a capacitance sum detector that detects a sum of the obtained stray capacitances of the pair of electrodes, a capacitance difference detector that detects a difference between the obtained stray capacitances of the pair of electrodes, and an individual capacitance calculator that calculates a capacitance of each of the positive and negative electrodes based on the sum detected by the capacitance sum detector and the difference detected by the capacitance difference detector; and wherein the capacitance difference detector comprises a common-mode charger/discharger that charges and discharges the pair of electrodes in the same phase, and a capacitance difference accumulation unit that accumulates a characteristic of the charge/discharge in the common-mode charger/discharger for a plurality of times and that detects the electrostatic capacitances of the positive and negative electrodes to obtain the differences between the electrostatic capacitances.

2. A proximity detector for detecting at least one of approach and position of an object based on a stray capacitance, the proximity detector comprising:
- a plurality of differential electrodes arranged on a support and comprised of a plurality of pairs of electrodes each having a positive electrode and a negative electrode;
- an individual capacitance detector for detecting an individual stray capacitance of each of the plurality of differential electrodes from stray capacitances of each pair of electrodes obtained by, for each pair of electrodes, repeatedly charging and discharging the positive and negative electrodes at the same time in opposite phases, and by repeatedly charging and discharging the pair of electrodes at the same time in the same phase; and
- a proximity calculator for computing at least one of the approach and the position of the object based on the detected individual stray capacitance of each of the plurality of differential electrodes;
- wherein the individual capacitance detector comprises a capacitance sum detector that, for each pair of electrodes of each differential electrode, detects a sum of the obtained stray capacitances of the pair of electrodes, a capacitance difference detector that, for each pair of electrodes of each differential electrode, detects a difference between the obtained stray capacitances of the pair of electrodes, and an individual capacitance calculator that, for each pair of electrodes of each differential electrode, calculates a capacitance of each of the positive and negative electrodes based on the sum detected by the capacitance sum detector and the difference detected by the capacitance difference detector; and
- wherein the capacitance difference detector comprises a common-mode charger/discharger that, for each pair of electrodes of each differential electrode, charges and discharges the positive and negative electrodes in the same phase, and a capacitance difference accumulation unit that accumulates a characteristic of the charge/discharge in the common-mode charger/discharger for a plurality of times and that detects the electrostatic capacitances of the positive and negative electrodes of each of the differential electrodes to obtain the differences between the electrostatic capacitances.

* * * * *